(12) United States Patent
Yasui et al.

(10) Patent No.: US 7,863,131 B2
(45) Date of Patent: Jan. 4, 2011

(54) SEMICONDUCTOR DEVICE AND MANUFACTURING METHOD FOR SEMICONDUCTOR DEVICE TO REDUCE THE LITHOGRAPHY MASKS

(75) Inventors: Kan Yasui, Kodaira (JP); Digh Hisamoto, Kokubunji (JP); Tetsuya Ishimaru, Kokubunji (JP)

(73) Assignee: Renesas Electronics Corporation, Kanagawa (JP)

( * ) Notice: Subject to any disclaimer, the term of this patent is extended or adjusted under 35 U.S.C. 154(b) by 539 days.

(21) Appl. No.: 11/189,078

(22) Filed: Jul. 26, 2005

(65) Prior Publication Data

US 2006/0035435 A1    Feb. 16, 2006

(30) Foreign Application Priority Data

Aug. 11, 2004    (JP) .............................. 2004-234335

(51) Int. Cl.
   *H01L 21/336*    (2006.01)
(52) U.S. Cl. ..................... 438/257; 438/195; 438/241
(58) Field of Classification Search ............... 438/195, 438/241, 257
   See application file for complete search history.

(56) References Cited

U.S. PATENT DOCUMENTS

| | | | | |
|---|---|---|---|---|
| 6,528,390 | B2* | 3/2003 | Komori et al. | 438/452 |
| 2004/0065917 | A1* | 4/2004 | Fan et al. | 257/315 |
| 2004/0085802 | A1* | 5/2004 | Yang et al. | 365/145 |
| 2004/0119107 | A1 | 6/2004 | Hisamoto et al. | |
| 2004/0185628 | A1* | 9/2004 | Choi | 438/288 |
| 2005/0205922 | A1* | 9/2005 | Liu et al. | 257/315 |
| 2005/0207199 | A1* | 9/2005 | Chen et al. | 365/51 |

FOREIGN PATENT DOCUMENTS

| | | |
|---|---|---|
| JP | 05-048113 | 8/1991 |
| JP | 05-121700 | 8/1991 |
| JP | 2001-326286 | 5/2000 |
| JP | 2004-186452 | 12/2002 |

OTHER PUBLICATIONS

Kianian et al., "A Novel 3 Volts-Only, Small Sector Erase, High Density Flash $E_2$PROM", Symposium on VLSI Technology Digest of Technical Papers, (1994) IEEE, pp. 71-72.

(Continued)

*Primary Examiner*—N Drew Richards
*Assistant Examiner*—Jae Lee
(74) *Attorney, Agent, or Firm*—Stites & Harbison, PLLC; Juan Carlos A. Marquez, Esq.

(57) ABSTRACT

Semiconductor device and manufacturing method for reducing the number of required lithography masks added to the nonvolatile memory in the standard CMOS process to shorten the production period and reduce costs. In a split-gate memory cell with silicided gate electrodes utilizing a sidewall structure, a separate auxiliary pattern is formed adjoining the selected gate electrodes. A contact is set on a wiring layer self-aligned by filling side-wall gates of polysilicon in the gap between the electrodes and auxiliary pattern. The contact may overlap onto the auxiliary pattern and device isolation region, in an optimal design considering the size of the occupied surface area. If the distance to the selected gate electrode is x, the ONO film deposit thickness is t, and the polysilicon film deposit thickness is d, then the auxiliary pattern may be separated just by a distance x such that $x<2\times(t+d)$.

8 Claims, 22 Drawing Sheets

OTHER PUBLICATIONS

Chen et al., "A Novel Flash Memory Device with S Plit Gate Source Side Injection and ONO Charge Storage Stack (SPIN)", Symposium on VLSI Technology Digest of Technical Papers, (1997), pp. 63-64.

Tanaka et al., "A 512kb MONOS Type Flash Memory Module Embedded in a Microcontroller", Symposium on VLSI Circuits Digest of Technical Papers, (2003).

* cited by examiner

FIG. 3
|  | Vmg | Vs | Vcg | Vd | Vsub |
|---|---|---|---|---|---|
| Read [V] | 1.5 | 0 | 1.5 | 1 | 0 |
| Write [V] | 12 | 5 | 1.5 | 1 | 0 |
| Erase [V] | -5 | 7 | 0 | OPEN | 0 |
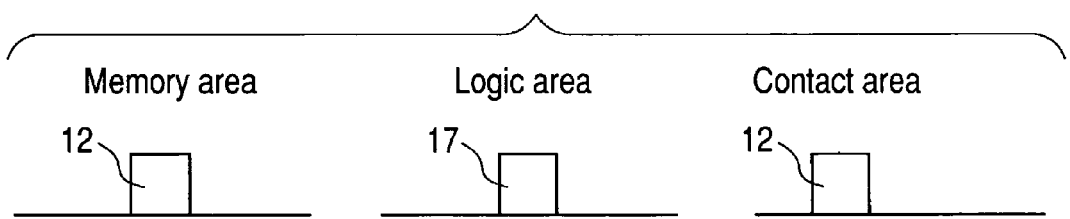
FIG. 4
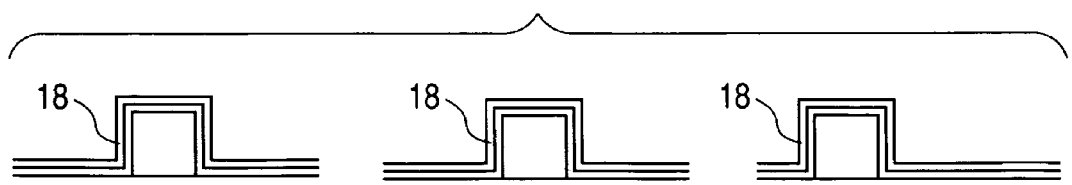
FIG. 5
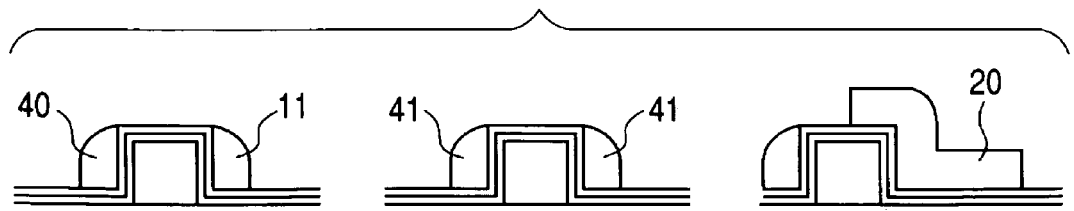
FIG. 6

SEMICONDUCTOR DEVICE AND MANUFACTURING METHOD FOR SEMICONDUCTOR DEVICE TO REDUCE THE LITHOGRAPHY MASKS

CLAIM OF PRIORITY

The present application claims priority from Japanese application JP 2004-234335 filed on Aug. 11, 2004, the content of which is hereby incorporated by reference into this application.

FIELD OF THE INVENTION

The present invention relates to a semiconductor device and a semiconductor manufacturing method for the same device, and more particularly to a semiconductor device and a semiconductor manufacturing method ideal for nonvolatile semiconductor memory devices mounted on the same substrate with semiconductor devices possessing logic calculation functions typified by microcomputers.

BACKGROUND OF THE INVENTION

Multi-function semiconductor devices can be fabricated by mounting a semiconductor nonvolatile memory cell on the same substrate with a logic semiconductor device. These multifunction semiconductor devices are widely utilized as built-in type microcomputers in industrial machinery, home appliances, and automobiles, etc.

These types of nonvolatile memories generally store a program required by that microcomputer are used to read out that program whenever needed. The cell structure of the nonvolatile memory for mounting along with these types of logic semiconductor devices are described as split-gate memory cells made up of selection MOS transistors and memory MOS transistors.

In order to employ source-side-injection (SSI) possessing good charge injection efficiency, this structure is designed for joint applications including high-speed writing, and providing a reduction in peripheral circuit area comprised of low-voltage transistors with a small device area as the memory cell selection transistors and transistors connecting to those memory cell transistors. Technical documents of the known art relating to this technology include for example, patent document 1, patent document 2, non-patent document 1, non-patent document 2, and non-patent document 3.

Method for retaining the electrical charge within the memory MOS transistor are: the floating gate type method (patent document 2, non-patent document 1) where the electrical charge is stored in electrically isolated conductive polysilicon, and the MONOS method (patent document 1, noon-patent document 2) for storing the electrical charge in an insulator film possessing properties similar to charge trapping properties of silicon nitride film.

The floating gate method possesses good charge retention characteristics and is widely utilized in large-capacity data storage flash memories and program storage flash memories for cellular telephones, etc. However, maintaining the charge coupling rate needed for controlling the voltage potential became more difficult in the floating gate as device integration became advanced, and the structure became more complicated. The oxide film enclosing the floating gate must be at least 8 nanometers thick in order to suppress leakage of the stored electrical charge, and the floating gate is approaching its miniaturization limits in term of high-speed and high-integration. If there is a flaw causing a leak path in even one position on the oxidized film around the floating gate, then the electrical charge retention of the floating gate drastically decreases.

In the MONOS system on the other hand, the electrical charge retention is generally poor compared to the floating gate, and the threshold voltage tends to drop with the logarithm of the time. Therefore, while this method has been known from a long time past its use is limited to only certain products.

However, a localized charge trapping method is utilized to hold the electrical charge in an insulating element so that even if there are several leak paths, there is few loss of the overall charge being held so the MONOS method is strongly resistant to defects in the oxidized film. Oxidized film thinner than 8 nanometers can therefore be used so this (MONOS) method is more suited to miniaturization and the probability of a drastic drop in the charge retention due to a defect is low so reliability can be easily predicted. Moreover, the memory cell structure is simple and can be easily mounted with logic circuits so that this method is again the focus of attention in recent years as device scaling is advanced.

The split-gate structure which is particularly well suited for scaling, is a side wall structure (patent document 1, non-patent document 2) in which a side wall is utilized to form a MOS transistor gate electrode from one of the MOS transistors utilized for self-alignment. In this case, the gate length of the transistor formed by self-alignment can be formed less than minimum lithographic resolution dimensions so that a tiny memory cell can be formed compared to the method of the conventional art which forms two transistors with photomask.

Even among split-gate memory cells using self-alignment, those cells formed with a MONOS structure on the self-aligning gate as disclosed for example in patent document 3, non-patent document 2, are ideal to be embedded with high speed logic circuits.

A cross sectional view of this memory cell is shown in FIG. 1. The memory gate electrode 11 is formed from an ONO film (oxide film/nitride film/oxide film) of $SiO_2$ film 13, SiN film 14, $SiO_2$ film 15 on the side wall of the selection gate electrode 12 and a polysilicon electrode with a side wall structure. A silicide layer 16 is formed on the upper section of the diffusion area 1 and 5, and selection gate electrode 12, and memory gate electrode 11.

In order to first form the selection gate electrode of this memory cell structure, the gate oxide film of the logic circuit section transistor can be formed simultaneously, with the selection gate electrode in a state where the silicon substrate surface (interface) is of good quality. A sensitive high-speed operation thin-film gate transistor with good interface quality can be formed first so the selection transistor and the transistors of the logic circuits possess better performance. The loading (reading) of the stored information can be performed just by high-performance selection transistor operation and their connecting transistors can all be thin-film low-voltage types so fast loading (read-out) can be achieved and the circuit area is reduced.

The memory cell array structure possessing these split-gate type MONOS memory transistors is shown in FIG. 2. Each cell and the opposing memory cell jointly possess a semiconductor region (highly doped region, hereafter called the source) adjoining the memory gate electrode 11; and the source line 1 is in parallel with the word line. Two types of word lines for the selection gate 3 and for the memory gate 2 extend in parallel toward the word lines. The bit lines 4 perpendicular to these word lines, connect to the semiconductor region (highly doped region, hereafter called the drain) adjoining the selection gates 12 of each cell.

Voltage conditions during typical operation are shown in FIG. 3. In the write operation, the semiconductor surface directly below the selection gate 3 is set to weak inversion state with approximately 12 volts and 5 volts applied to memory gate 2 and the source 1 by the source side injection method (SSI method), and hot electrons are injected into the silicon nitride film serving as the charge trapping film of the ONO film, by the strong electrical field occurring between the semiconductor substrate surface and the memory gate 2.

In the erase operation, the hot hole injection method (BTBT method) via a tunnel between bands is utilized. A voltage of approximately −5 volts is applied to the memory gate 2 and 7 volts is applied to the source 1 as a reverse bias, and the strong electric field on the edge of the diffusion area generates hot holes via the tunneling between bands, and these hot holes are injected into the memory gate 2. To read information, 1.5 volts is applied to both the memory gate 2 and selection gate 3, and 1 volt is applied to the drain (bit line 4), and the read information determined by amplitude of the current flowing in the drain (bit line 4).

The process for manufacturing the memory cell containing split-gate type MONOS memory transistors is characterized by good compatibility with the standard CMOS process, and can be used to mount components such as microcomputers on the semiconductor memory. The process flow compatible with when mounting via the standard CMOS process is shown utilizing FIG. 4 through FIG. 10.

FIG. 4 is a cross-section view of the stage for forming the gate electrode structure of polysilicon on the silicon substrate. Though not shown in the figure, in the previous stage, the structure of the field isolating insulator is formed utilizing the conventional method, and the gate insulator film and polysilicon gate electrode material films are formed. The memory area selection transistor and the logic area transistors have the gate insulator in common. The reference numeral 12 denotes the selection gate electrode, and the reference numeral 17 denotes the gate electrode for the logic area transistor.

The stage for forming the three-layer ONO film 18 structure of SiO$_2$ film, SiN film, SiO$_2$ film is next shown in FIG. 5.

The second polysilicon is deposited as the memory gate electrode material and, etchback performed by dry etching to leave polysilicon film as the side wall electrode only on the side of the gate electrode as shown in the state in FIG. 6. The reference numeral 20 denotes the contact extension, reference numeral 40 is the memory gate side wall electrode removed later, and reference numeral 41 is the logic area side wall electrode removed later. Among the side wall electrodes that were formed, the unnecessary side wall electrode 40 on one side, and the side wall electrode 41 on both sides of the logic area are removed by etching, and when the ONO film whose lower layer of polysilicon was removed, and the ONO film formed on the upper surface of the select electrode 12 are removed the state shown in FIG. 7 is attained. The ONO film formed on the upper surface of the select gate electrode 12 is removed in order to simultaneously silicide the upper surface of the select gate electrode 12 and lower the resistance of the select gate electrode 12, so that the resistance of the memory gate to be formed is lowered during siliciding.

At this point, the SiO$_2$ film forming the side wall of the logic area transistor and the MONOS memory cell is deposited and etched back to form the state in FIG. 8. Reference numeral 19 is the oxide film side wall. The state where siliciding was performed to lower the resistance of the gate electrode and diffusion area is shown in FIG. 9. Reference numeral 27 is the silicided section. The first layer of a resistive film 42 is then deposited, and the stage after planarizing and forming of the contact areas is shown in FIG. 10. The description of the standard process for forming the metal wiring layers of approximately three to six layers is omitted.

The masks required for embedding nonvolatile memories in the related art can be broadly grouped into masks for ion injection, and structural forming masks. Of these mask types, one structural forming mask is utilized for removing the polysilicon side wall electrode on one side of the selection gate; and another structural forming mask is utilized for forming the wiring contact areas to the memory gate electrode. Of these structural forming masks, the latter mask is intended only for forming the contact area with the wiring, regardless of the fact that the memory gate electrode is formed by self-alignment and essentially does not require a mask.

The contact forming section is next described in further detail. The layout of the contact forming region (connecting) to the memory gate electrode in the technology of the related art is shown in FIG. 11. One word line formed from the memory gate and the select gate extends to the device isolation region and forms the contact area.

In the technology of the related art as shown in FIG. 7, the ONO film on the upper surface of the select gate 12 must be removed in order to silicide the selection gate electrode 12 and memory gate electrode 11 in the same process. However as shown in FIG. 10, the first layer of the insulator film 42 is common with on the selection gate electrode 12 and on the memory gate electrode 11 after the siliciding, so that when forming the contact hole on the insulator film 42 for receiving the contact on the memory gate electrode 11, the surface of the selection gate electrode 12 might become exposed rather than just the surface of the memory gate electrode 11.

This unwanted exposure is caused by the fact that the width of the memory gate electrode is approximately 60 nanometers and the memory gate electrode is a side wall electrode that is small compared to the width of the contact hole; and the fact that the selection gate electrode 12 and the memory gate electrode 12 are only separated by a distance 20 nanometers as the thickness of the ONO film 18; and the fact that the photolithography alignment error in the process for forming the contact hole is approximately 60 nanometers which is the same as the width of the memory gate electrode 11.

When forming the contact hole in this way, and the surface of the memory gate electrode 11 and the surface of the selection gate electrode 12 are exposed within one contact hole, the forming of the contact might cause the memory gate electrode 11 and selection gate electrode 12 to short and disable the nonvolatile memory.

To eliminate this possibility, a dedicated contact region 20 is formed by photolithography as shown in FIG. 11. This contact region 20 is formed by utilizing a dedicated mask, and covering just the contact region 20 with photoresist during etchback of the memory gate electrode so that a section with no etchback is formed. The reference numeral 21 is the contact. The line taken along A-A' in the cross sectional view in FIG. 11 is jointly recorded in FIG. 12, and the manufacturing process flow for the memory area and the logic area are jointly described in FIG. 4 through FIG. 10. The contact region 20 can in this way be formed at a position isolated from the selection gate electrode 12 so that the contact 21 for the memory gate electrode 11 as described above, does not connect to the selection gate electrode 12, and the memory gate electrode 11 is prevented from shorting to the selection gate electrode 12. In FIG. 11, the contact region 20 overlaps onto the selection gate electrode 12 however as clearly shown in the cross sectional view in FIG. 12, an ONO film is formed between the contact region 20 and the selection gate electrode 12 so that because of the electrical insulation, there will be no shorts. A technology for forming a contact auxiliary pattern as a technique for reducing the masks for the split-gate type nonvolatile memory is disclosed in FIG. 1 and FIG. 2 of the patent document 4.

[Patent document 1] JP-A No. 48113/1993
[Patent document 2] JP-A No. 121700/1993
[Patent document 3] JP-A No. 186452/2004
[Patent document 4] JP-A No. 326286/2001
[Non-patent document 1] IEEE, 1994 Symposium on VLSI Technology, Review pp. 71-72
[Non-patent document 2] IEEE, 1997 Symposium on VLSI Technology, Review pp. 63-64
[Non-patent document 3] IEEE, 2003 Symposium on VLSI Circuits Digest of Technical Papers, Session No. 16, Academic paper No. 2.

SUMMARY OF THE INVENTION

A manufacturing process (for mixed mounting of) nonvolatile semiconductor memory devices utilizing the standard CMOS logic process is needed that is capable of reducing the number of masks and capable of jointly using as much as possible the manufacturing steps common to the standard CMOS process.

The technology of the related art requires a dedicated mask for forming the contact region as previously described and was therefore incapable of utilizing the advantages of the self-alignment method.

The technology of the related art also had the problem that at least two position alignments made up of position alignment of the mask for installing the contact region, and alignment of the mask for forming the contact holes. Therefore when utilizing a designing a layout that took the photolithographic alignment into account, the clearance between the adjacent word lines was small, and a dense integration of the memory arrays was impossible.

A technique for reducing masks in split-gate type nonvolatile memories of the related art is disclosed in patent document 4. However, the patent document 4 is only a technology for forming contacts only on floating gates possessing a side wall gate structure and so when a process for siliciding the control gate surface and the floating gate surface was applied, and the contact auxiliary pattern surface was covered by an insulator film after siliciding, then a mask was required in order to selectively form an insulator film on the surface of the contact auxiliary pattern, so that the number of masks could not be reduced.

Moreover, when the control gate was made a polycide gate in order to lower the resistance of the control gate, the process for siliciding the control gate, and the process for siliciding the floating gate were separate processes so that two siliciding processes were required and therefore the manufacturing process became complex.

The patent document 4 is technology for forming a contact in a filler section comprised from a section of the floating gate between the contact auxiliary pattern and the control gate. In FIG. 1 of this patent document 4, an electrical short with the control gate might possibly occur when an offset or deviation in the position alignment for forming the contact occurs. Also, as shown in FIG. 2 of patent document 4, when a filler section is formed from multiple contact auxiliary patterns in order to avoid the possibility of an electrical short, the surface area size of the contact auxiliary patterns becomes large so that reducing the pitch width between adjacent control gates becomes impossible.

A typical example of this invention is shown as follows. Namely, a process for depositing a first conductive film over a semiconductor substrate, and forming a first gate electrode and auxiliary pattern and; a process for forming a first insulator film over the first gate electrode, auxiliary pattern, and the semiconductor substrate and; a process for depositing a second conductive film on the first insulator film and, by etchback of the second conductive film, respectively forming a first side wall electrode via the first insulator film on the side surface of the first gate electrode, as well as forming a second side wall electrode via the first insulator film on the side surface of the auxiliary pattern and; a process for exposing the upper surface of the auxiliary pattern and the first gate electrode by stripping away the first insulator film formed on the auxiliary pattern and the first gate electrode and; a process for siliciding the upper surface of the first gate electrode, the upper surface of the auxiliary pattern, and the surface of the first side wall electrode and; a process for forming a second insulator film over the auxiliary pattern and the second side wall electrode and; a process for forming at least one or more contact holes on the second insulator film, and exposing the auxiliary pattern and side wall electrode in the forming of one contact hole and; a process for forming a contact in a contact hole; and the first side wall electrode is contacting the second side wall electrode.

The representative effect rendered by the above means of this invention is the simplifying of the manufacturing process for semiconductor devices capable of high-speed operation.

BRIEF DESCRIPTION OF THE DRAWINGS

FIG. 3 is a table of typical operating conditions;

FIG. 4 is a descriptive view of the process flow in the related art;

FIG. 5 is a descriptive view of the process flow in the related art;

FIG. 6 is a descriptive view of the process flow in the related art;

DETAILED DESCRIPTION OF THE PREFERRED EMBODIMENTS

Figure 1:
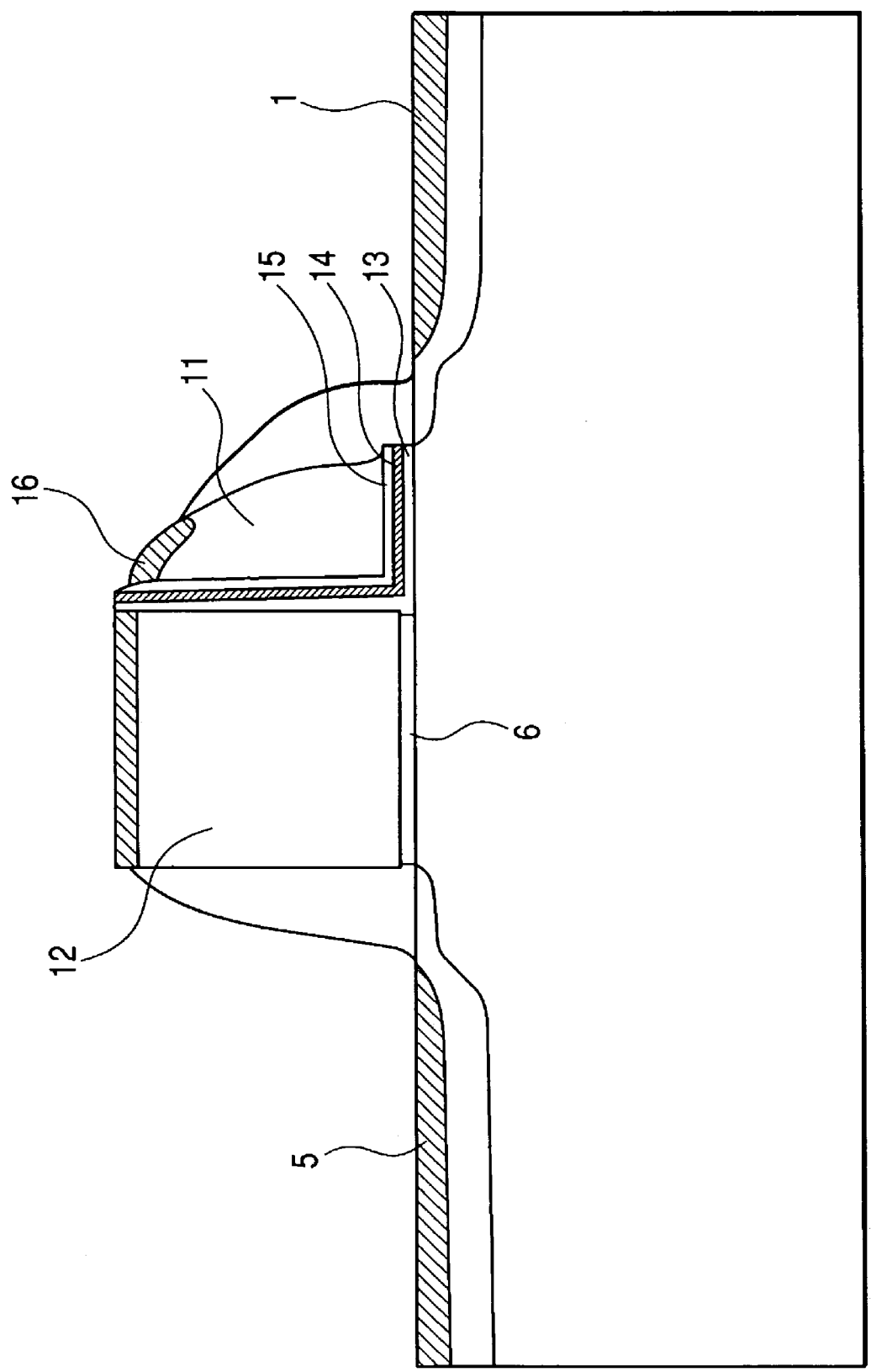
FIG. 1 is a cross sectional view of the MONOS memory cell with a split-gate structure.

The embodiments of this invention are hereinafter described while referring to the drawings.

First Embodiment

Figure 2:
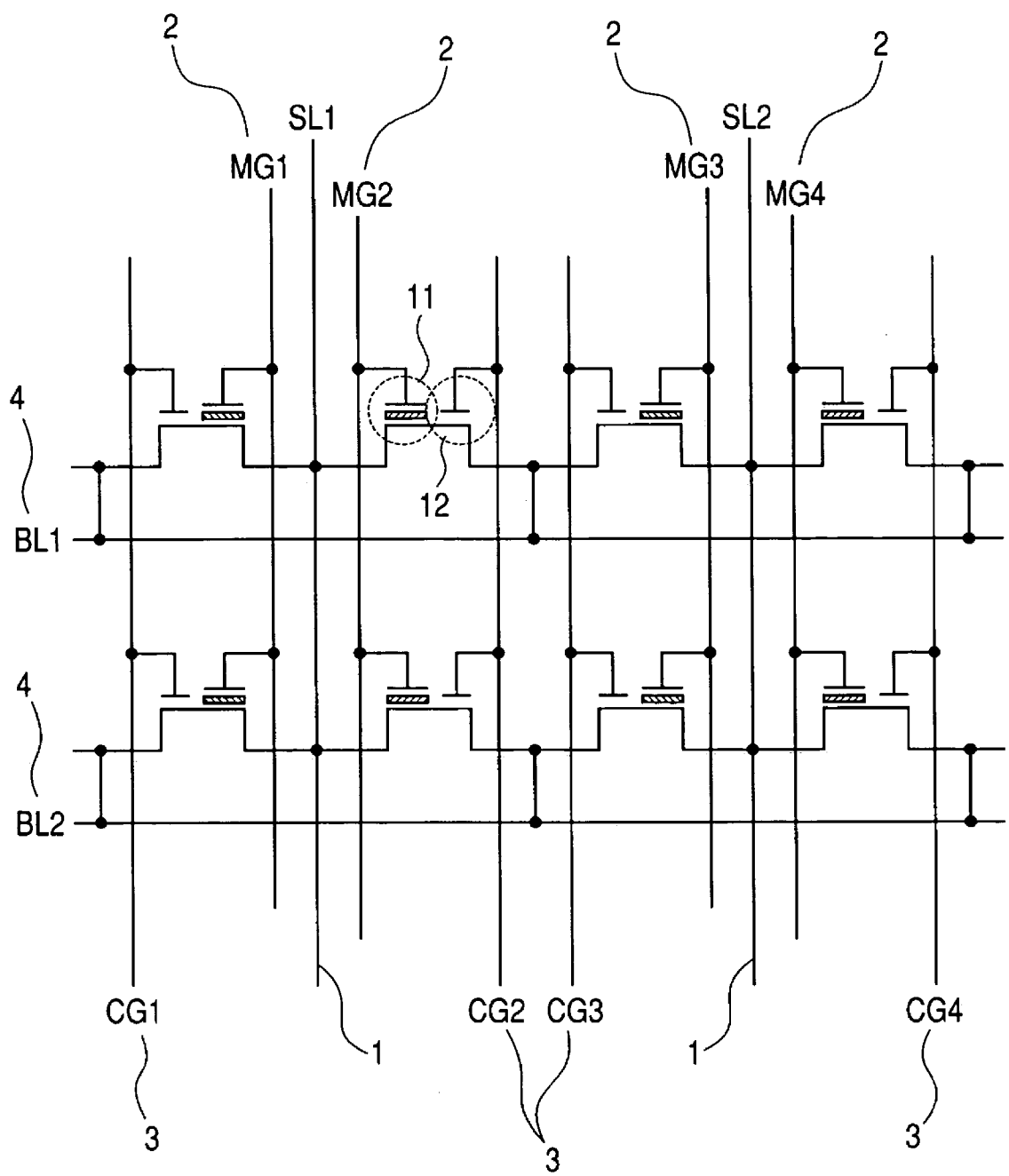
FIG. 2 is a structural view of the memory array for this invention.
Figure 7:
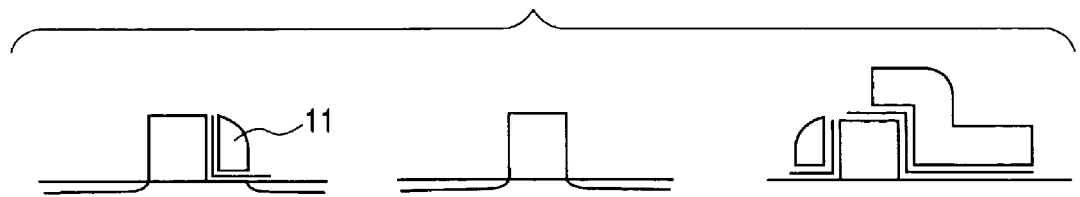
FIG. 7 is a descriptive view of the process flow in the related art.
Figure 8:
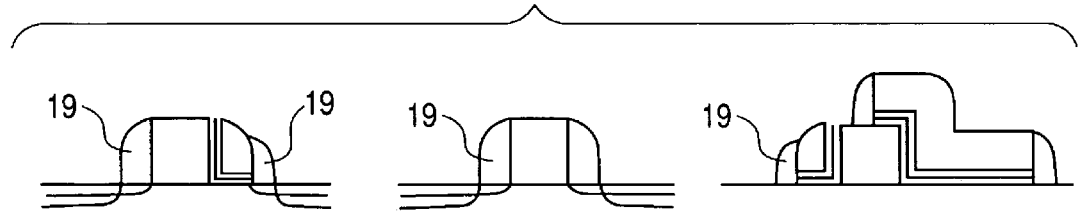
FIG. 8 is a descriptive view of the process flow in the related art.
Figure 9:
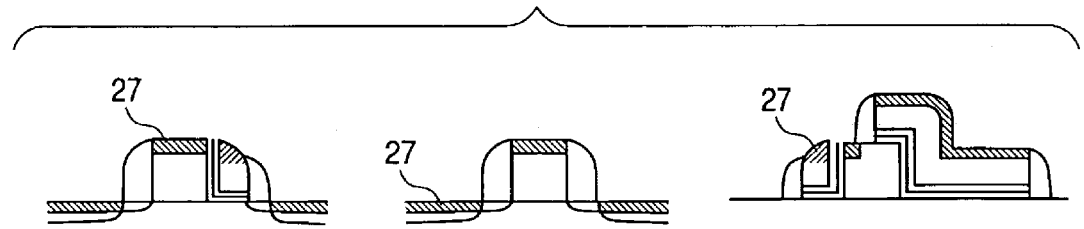
FIG. 9 is a descriptive view of the process flow in the related art.
Figure 10:
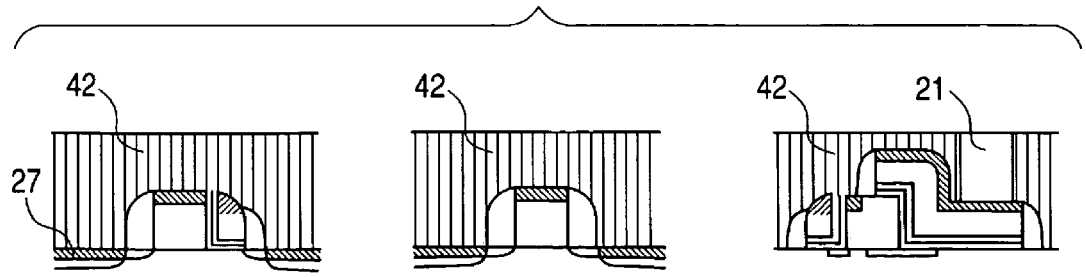
FIG. 10 is a descriptive view of the process flow in the related art.
Figure 11:
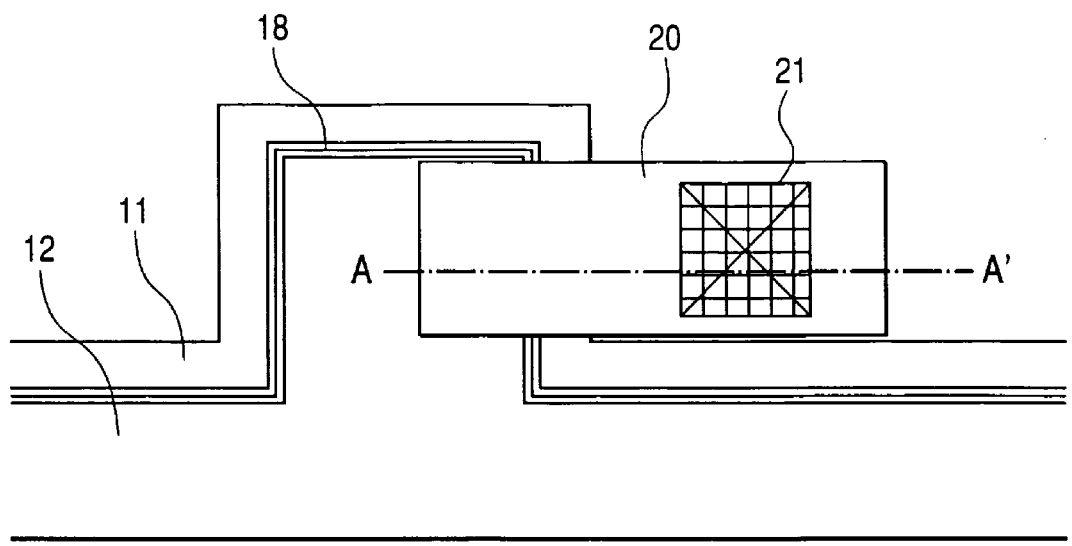
FIG. 11 is a view of the layout of the contact area of the related art.
Figure 12:
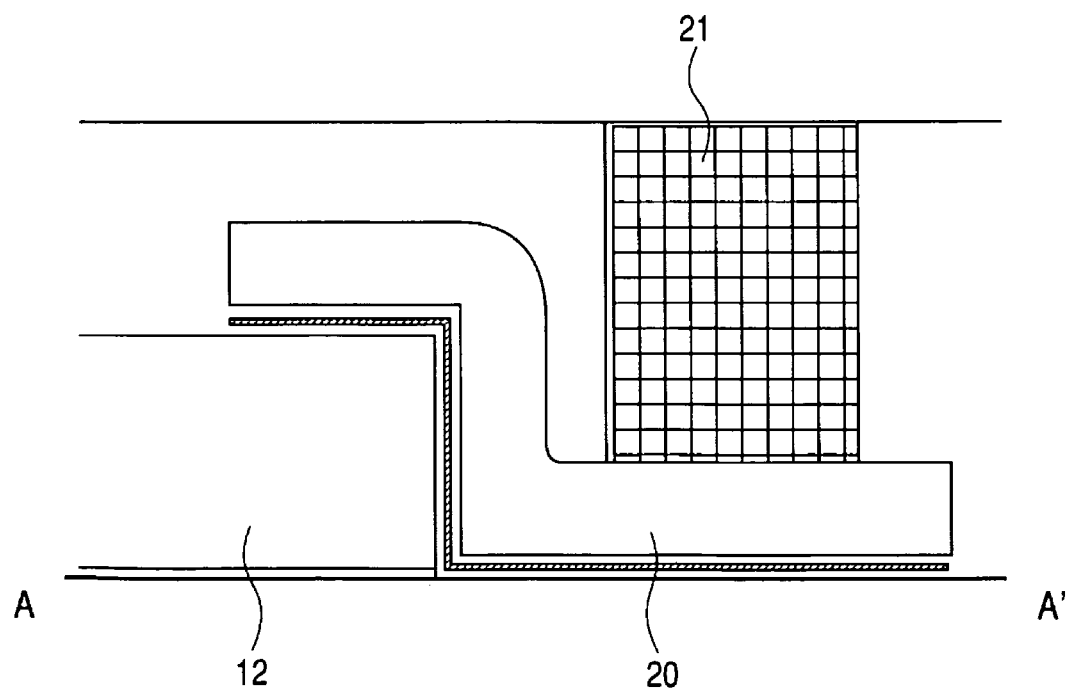
FIG. 12 is a cross sectional view of the contact area of the related art.
Figure 13:
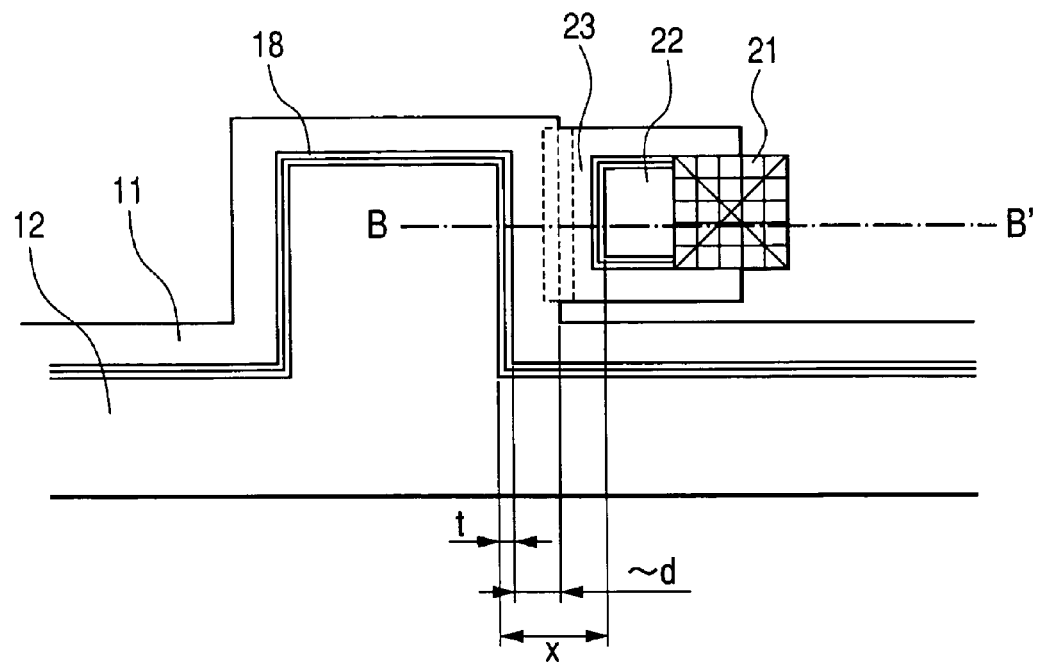
FIG. 13 is a view of the layout of the contact area of this invention.
Figure 14:
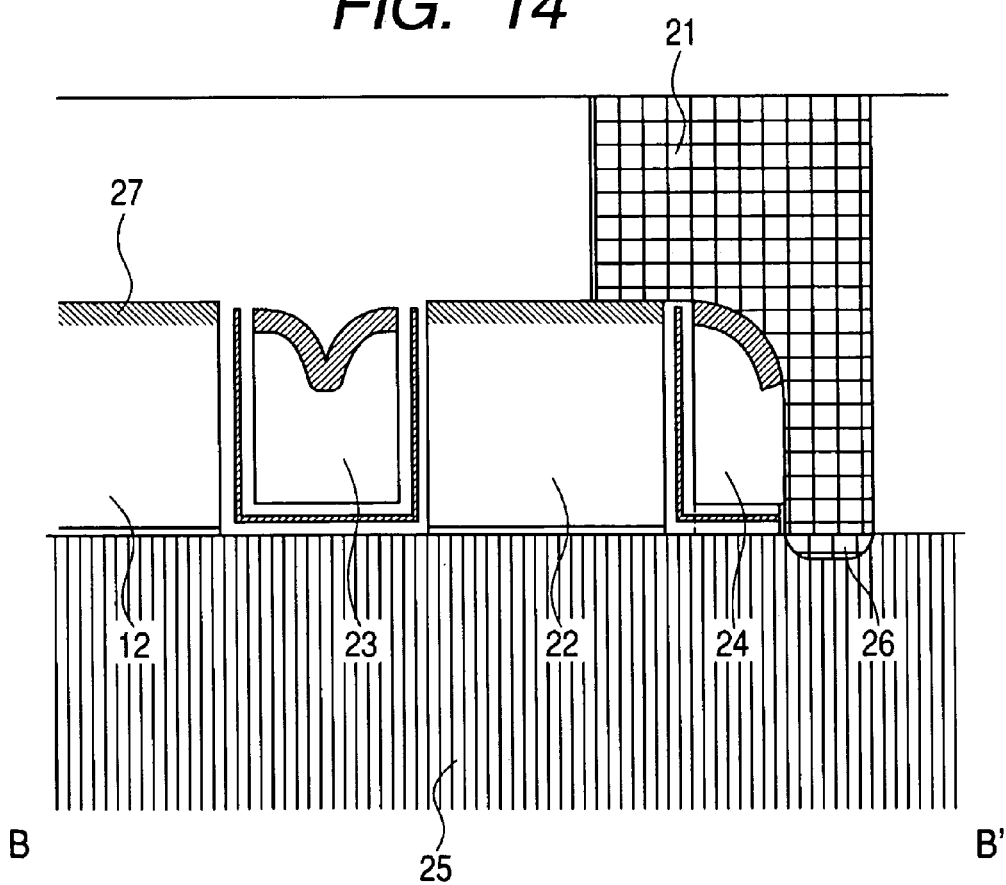
FIG. 14 is a cross sectional view of the contact area of this invention.
Figure 15:
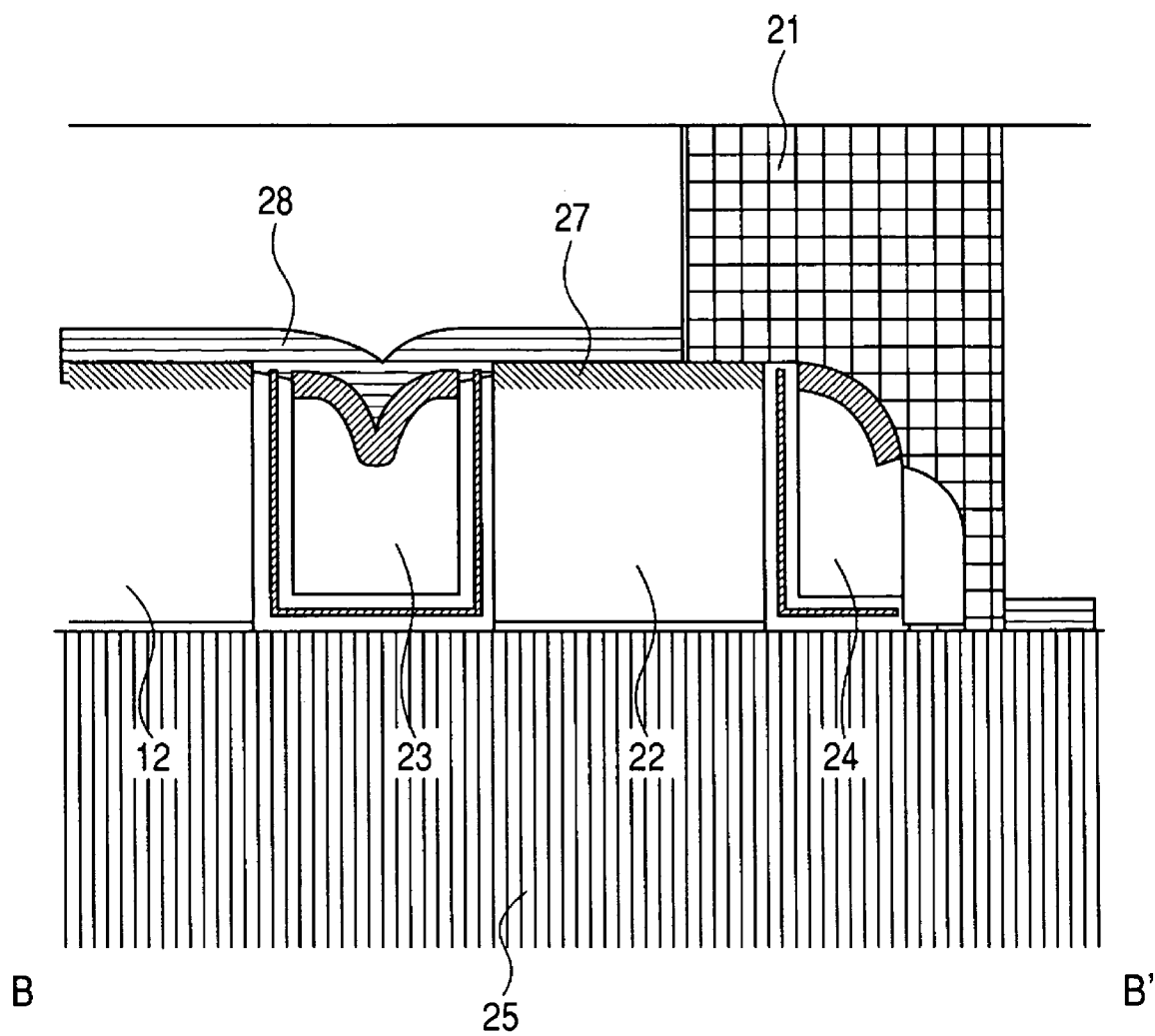
FIG. 15 is a cross sectional view (during application to SAC process) of the contact area of this invention.

The first embodiment is described while referring to FIG. 1 through FIG. 3 and FIG. 16 through FIG. 30. The memory cell is a MONOS memory cell with the split-gate structure shown in FIG. 1, and the array structure shown in FIG. 2. The voltage conditions for read, write and erase are shown in FIG. 3.

Figure 16:
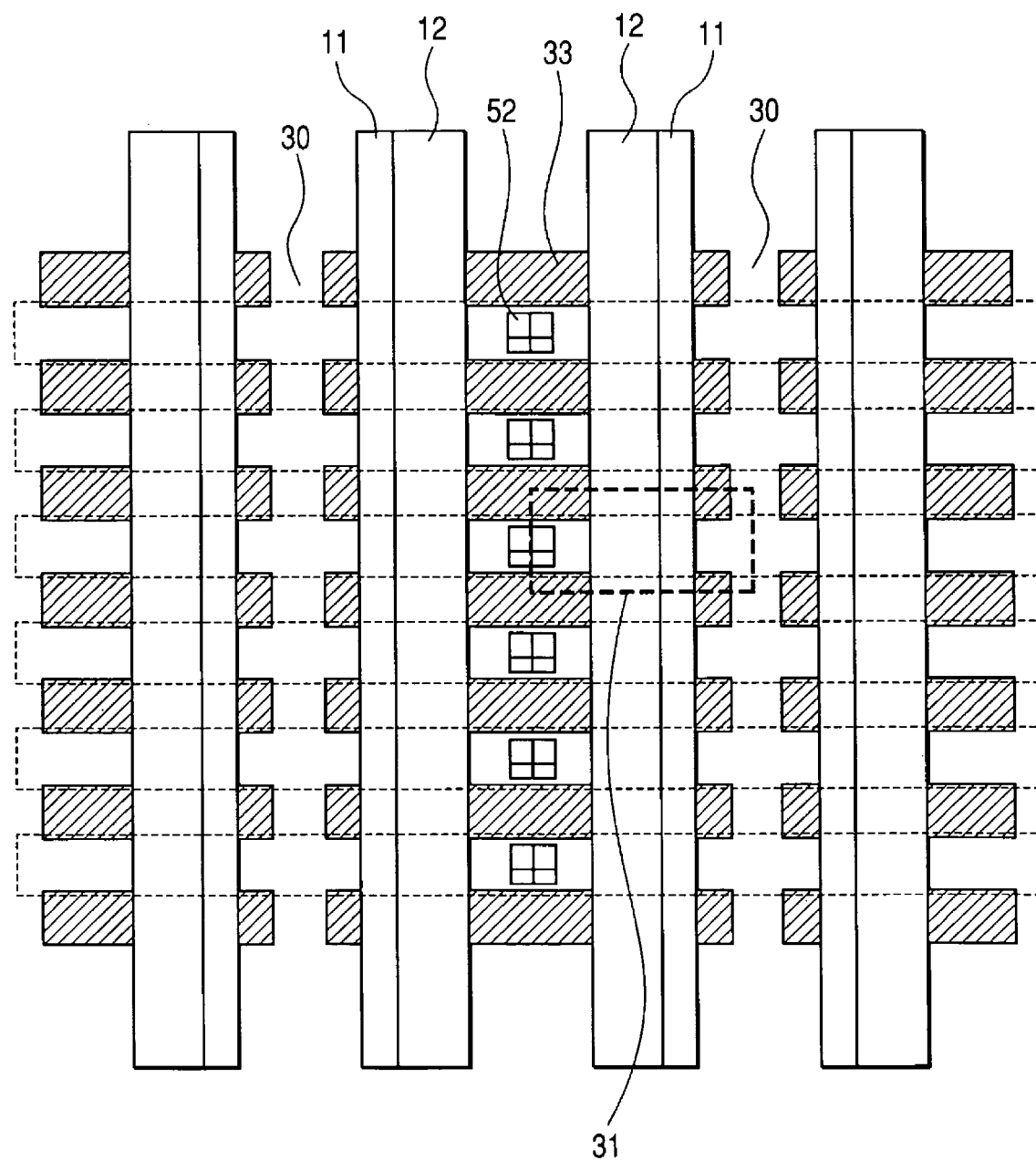
FIG. 16 is a layout view of the memory array of the first embodiment of this invention.

A flat layout view within the memory cell array is shown in FIG. 16. Field isolating insulators 33 are formed on the semiconductor substrate in correctly established arrays. In FIG. 16, the semiconductor substrate other than the field isolating insulators 33 is the activated region where the selection transistor, memory transistor, source line, and bit line are formed. The reference numeral 12 denotes the gate electrode for the selection transistor. The reference numeral 11 denotes the gate electrode for the memory transistor. The gate electrode 12 and gate electrode 11 are both formed to span the activated region and field isolating (device isolation film). The reference numeral 30 denotes the source line and is formed within the activated region. The reference numeral 52 is the contact forming a section of the bit line and formed on the drain side of the memory transistor and the selection transistor. The section enclosed by the dashed (broken) line 31 in FIG. 16 is equivalent to one memory cell. In other words, the selection transistor and the memory transistor are contained within the memory cell. The memory gate electrodes 11 of the adjacent memory cells are formed facing each other as clearly shown in FIG. 16, and the selection gate and memory gate are formed bilaterally symmetrical to each other. Though not shown in FIG. 16, a contact region is formed in the direction (word line direction) that the gate electrode 11 and the gate electrode 12 extend, in order to apply a voltage to the gate electrode 11 of the memory transistor and the gate electrode 12 of the selection transistor; and make contact with the respective gate electrodes on the field isolating insulator film in the device isolation region.

Figure 17:
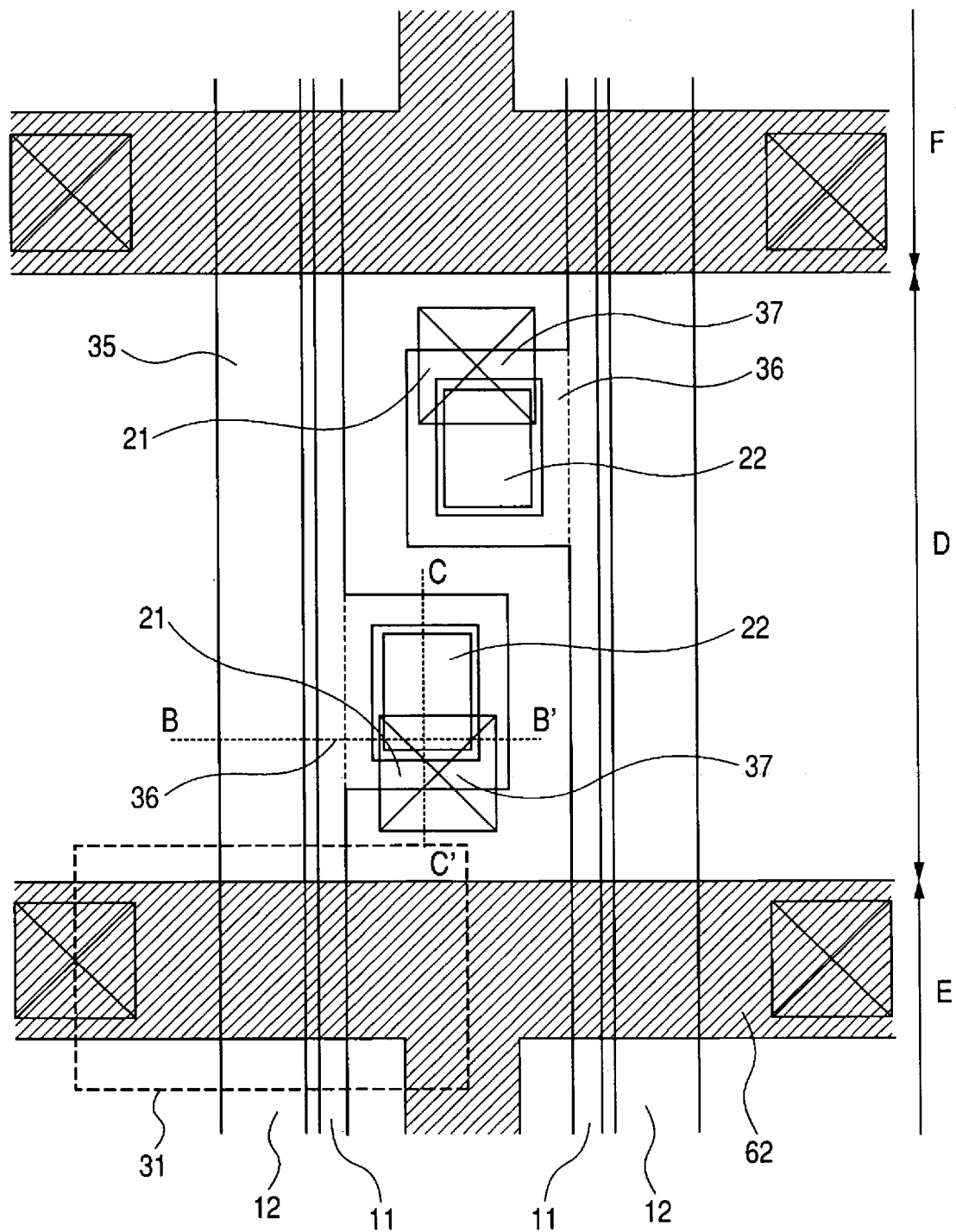
FIG. 17 is a layout view of the contact area of the first embodiment of this invention.
Figure 31:
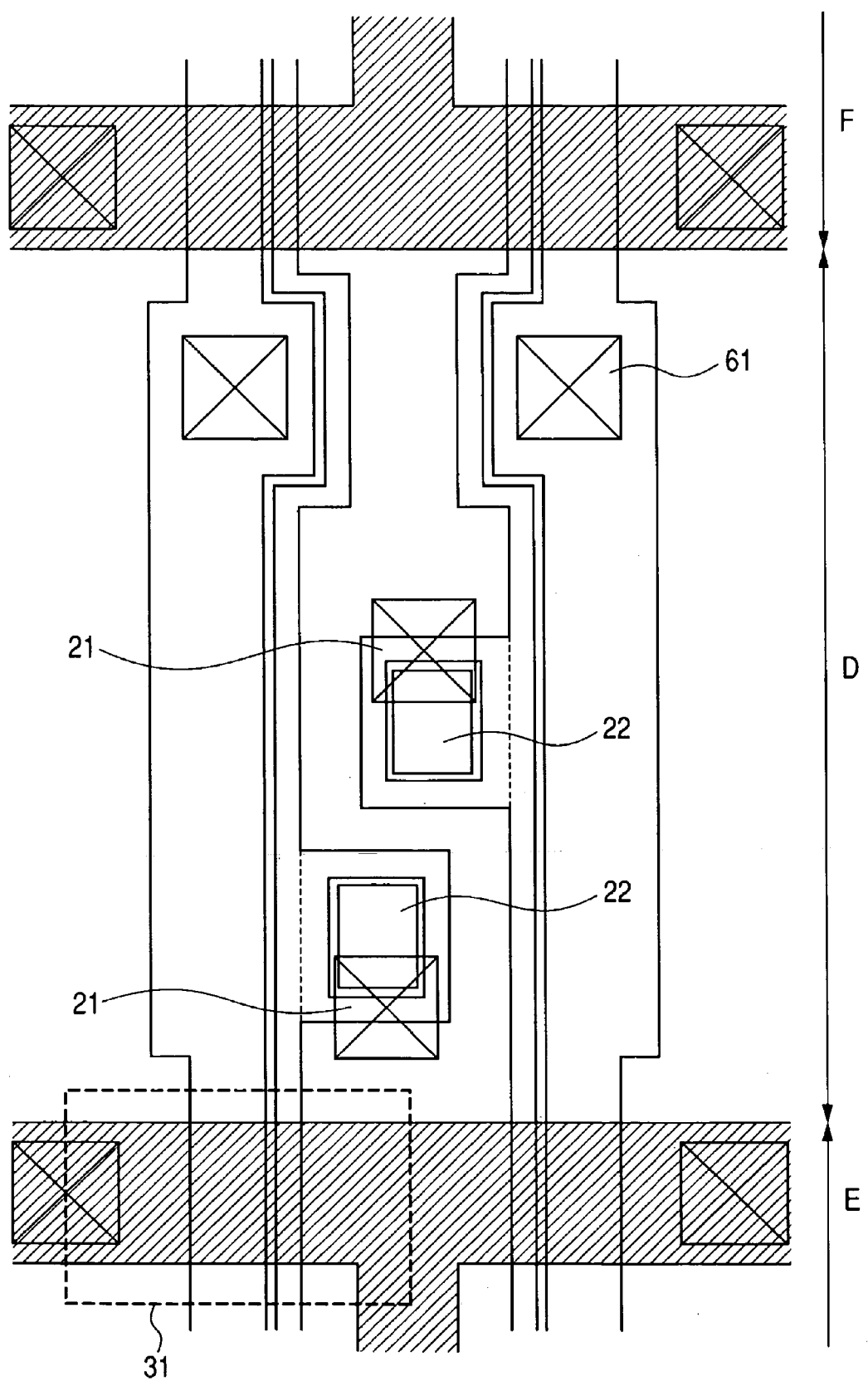
FIG. 31 is a layout view of the contact area of the first embodiment of this invention.

A flat layout view of the contact region of the memory area is shown in FIG. 17. Here, D is the device isolation region, and the contact region is within the region D. Also, E is the first memory array region, and Fi is the second memory array F region. A contact region is present between these memory arrays. The section 31 enclosed by the broken (dashed) lines is one memory cell region. The oblique line 62 indicates the active region (device forming region) within the memory array region. A contact auxiliary pattern 22 is formed adjacent to the extended part 35 of the word electrode 12 (word line), and a contact 21 is formed on the memory gate extended part 37 connected electrically by conductive material embedded in both the clearances 36. Here, the contacts 21 are formed at two locations in different levels in order to array the contact wiring to the adjacent memory gates in parallel with the respective word lines. FIG. 31 shows a flat layout of when the contacts are formed on the selection gate electrode 12. The reference numeral 61 is the selection gate electrode contact.

The manufacturing process flow is shown in FIG. 18 through FIG. 24. A 0.18 micrometer process rule is utilized in the manufacturing. FIG. 18 through FIG. 24 show the memory area (left row) and logic area (center) and the contact area (right row). The layout of the contact area (right row) is expressed by the cross section of B-B' in FIG. 17. A cross sectional view of the section C-C' intersecting this cross section (B-B') is shown in FIG. 25.

Figure 18:
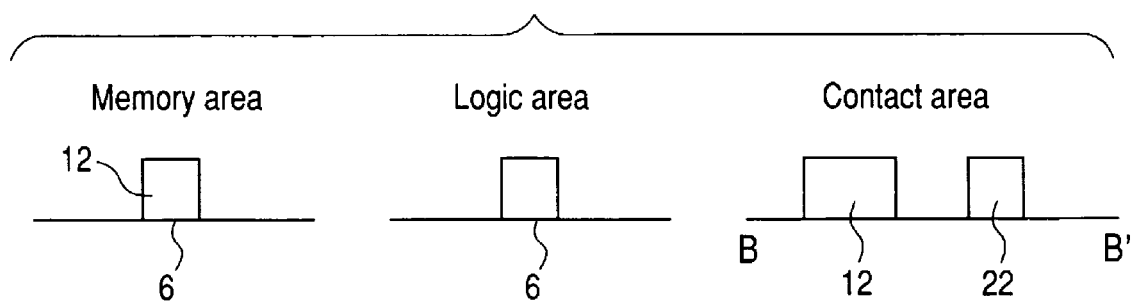
FIG. 18 is a concept view of the process flow in the first embodiment of this invention.

FIG. 18 is a cross sectional view of the stages for forming the gate electrode structure 12 made from polysilicon to a height of 250 nanometers, after forming the gate insulator film 6 to a film thickness of 3 nanometers on P-type silicon substrate. Though not shown in the drawing, a shallow trench isolation is formed to a thickness of 350 nanometers in a previous stage. The memory area selection transistor and the logic area transistor have the gate insulator film 6 in common. The contact area is formed on the shallow trench isolation region; and the contact auxiliary pattern 22 is formed from the same polysilicon as the gate electrode structure 12. Here maintaining the respective distances at a fixed distance is essential during forming of the gate electrode structure 12 and the contact auxiliary pattern 22 and the reason this is essential is related later on.

Figure 19:
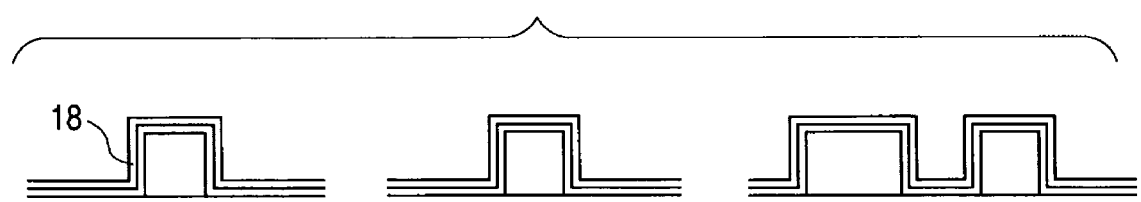
FIG. 19 is a concept view of the process flow in the first embodiment of this invention.

An ONO film with a three-layer structure of $SiO_2$ film (4 nm), SiN film (10 nm), $SiO_2$ film (5 nm) is next deposited as shown in FIG. 19 over the gate electrode structure 12 and the semiconductor substrate. The silicon nitride film functions as an electrical charge trapping film to accumulate memory transistor electrical charges. Each of the silicon oxide films functions as a potential barrier to the electrical charges to suppress the leakage from the electrical charge trapping film.

Figure 20:
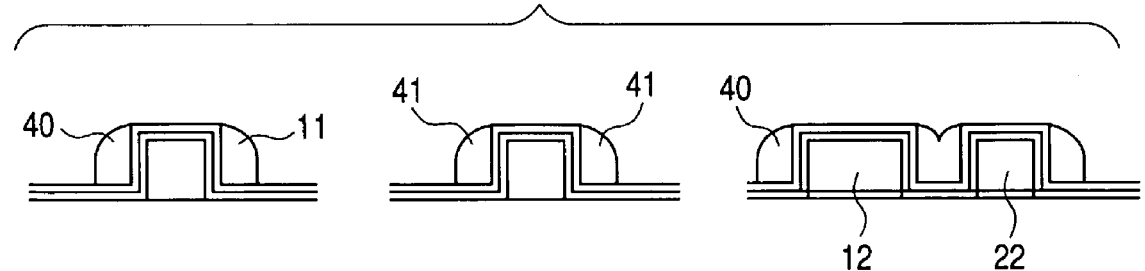
FIG. 20 is a concept view of the process flow in the first embodiment of this invention.

Moreover, as shown in FIG. 20, a polysilicon film doped with impurities is deposited to a thickness of 75 nanometers over the ONO film in order to form a memory gate electrode 11. The polysilicon film is etched back by performing anisotropic etching and, a side wall electrode is formed just on the side of the gate electrode serving as the step section in FIG. 19. This side wall electrode is formed by anisotropic etching so that a memory gate electrode with a gate length of approximately 60 nanometers can be formed and with only a slight amount etched away to the side.

Here, the gap between the side surface of the contact auxiliary pattern 22 and the side surface of the gate electrode 12 in the contact section is kept within a fixed distance so that there is no separation of the polysilicon film doped with impurities formed between the contact auxiliary pattern 22 and the selection gate electrode 12. In the present embodiment, that fixed distance is equivalent to 188 nanometer which is double that sum of the 19 nanometer thick ONO film and the 75 nanometer thick polysilicon film. At the stage in FIG. 18, if the gate electrode 12 and contact auxiliary pattern 22 are formed at least within a distance of double the sum of the ONO film deposit thickness and the gate polysilicon film thickness of the sidewall electrode gate, then a structure with mutually connected side wall gates can be easily achieved.

In the method of the related art, the photo-resist is coated on after forming (depositing) a polysilicon film doped with impurities so that anisotropic etching was performed after patterning with photo-resist by utilizing a dedicated lithographic mask, in order to leave a polysilicon film on the section where the contact was formed. In the present embodiment however, an auxiliary pattern can be formed with the mask used for the selection gate electrode so that no additional mask is used for forming the contact region.

Figure 21:
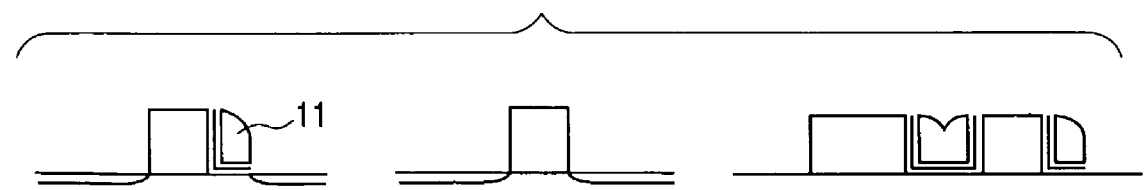
FIG. 21 is a concept view of the process flow in the first embodiment of this invention.

Next as shown in FIG. 21, an unneeded side of the side wall electrode 40 among the side wall electrodes that were formed, and the side wall electrodes 41 on both sides of the logic area are stripped away by etching using photolithography or dry etching, and the underlayer of the ONO film whose polysilicon was removed is also stripped away in the same way. The method for stripping away the film is not limited to dry etching and even wet etching may be utilized. However, the silicon nitride film and the silicon oxide film possess a high etching rate so that an etching gas or etchant that matches each film must be separately used as needed. At this point in time, the gate electrode is masked and the semiconductor region forming the source and drain of the transistor is formed by ion implantation. Here, in a process subsequent to forming the upper surface of gate electrode 12, the ONO film on the upper surface of gate electrode 12 is stripped away in order to simultaneously silicide the memory gate electrode 11. The ONO film formed on the upper surface of the auxiliary pattern 22 is simultaneously stripped away at this time.

Figure 22:
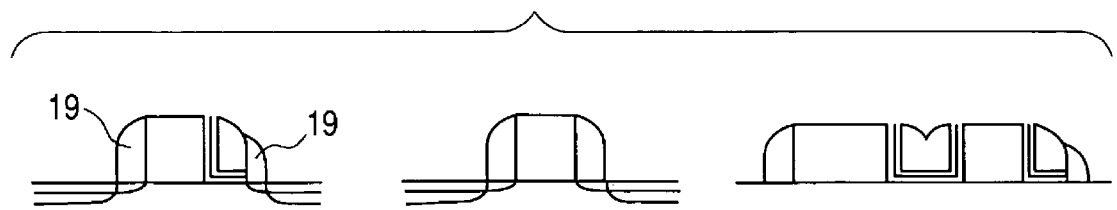
FIG. 22 is a concept view of the process flow in the first embodiment of this invention.

As shown in FIG. 22, from here, the $SiO_2$ film forming the side wall of the gate electrode of the logic area transistor and the gate electrode for the memory area transistor are deposited, and etched back by anisotropic etching.

Figure 23:
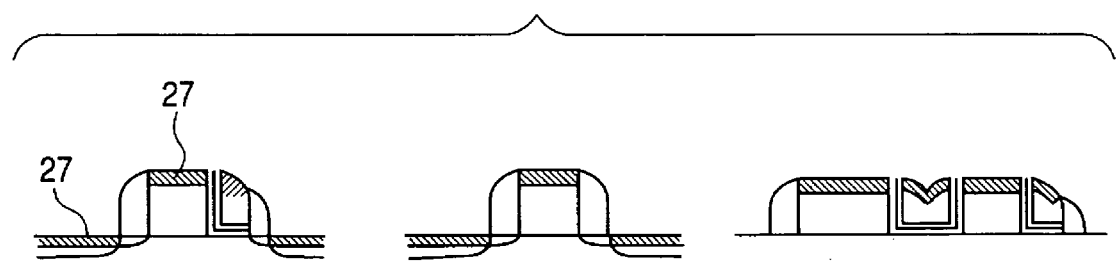
FIG. 23 is a concept view of the process flow in the first embodiment of this invention.

As shown in FIG. 23, siliciding of the substrate surface of the semiconductor region functioning as the source and drain of the memory cell, and the gate electrode of the memory transistor, and gate electrode of the selection transistor for the memory area is performed, to form a silicide layer 27. The silicidation is performed to lower the resistance of the semiconductor region and gate electrode, and for example is performed by depositing a metal layer such as cobalt by sputtering and then annealing (that layer). The metal for the silicidation is not limited to cobalt and other metals such as nickel may be utilized.

In this process, silicidation of the substrate surface of the semiconductor region functioning as the source and drain and the gate electrode of the transistor logic area is also performed simultaneously. Metal that did not react with the gate electrode and substrate by the silicidation anneal is also removed.

Figure 24:
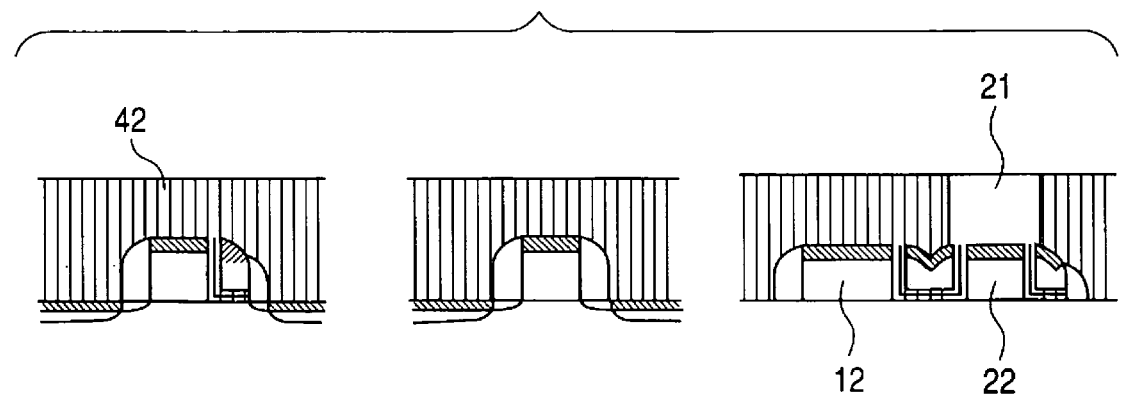
FIG. 24 is a concept view of the process flow in the first embodiment of this invention.
Figure 25:
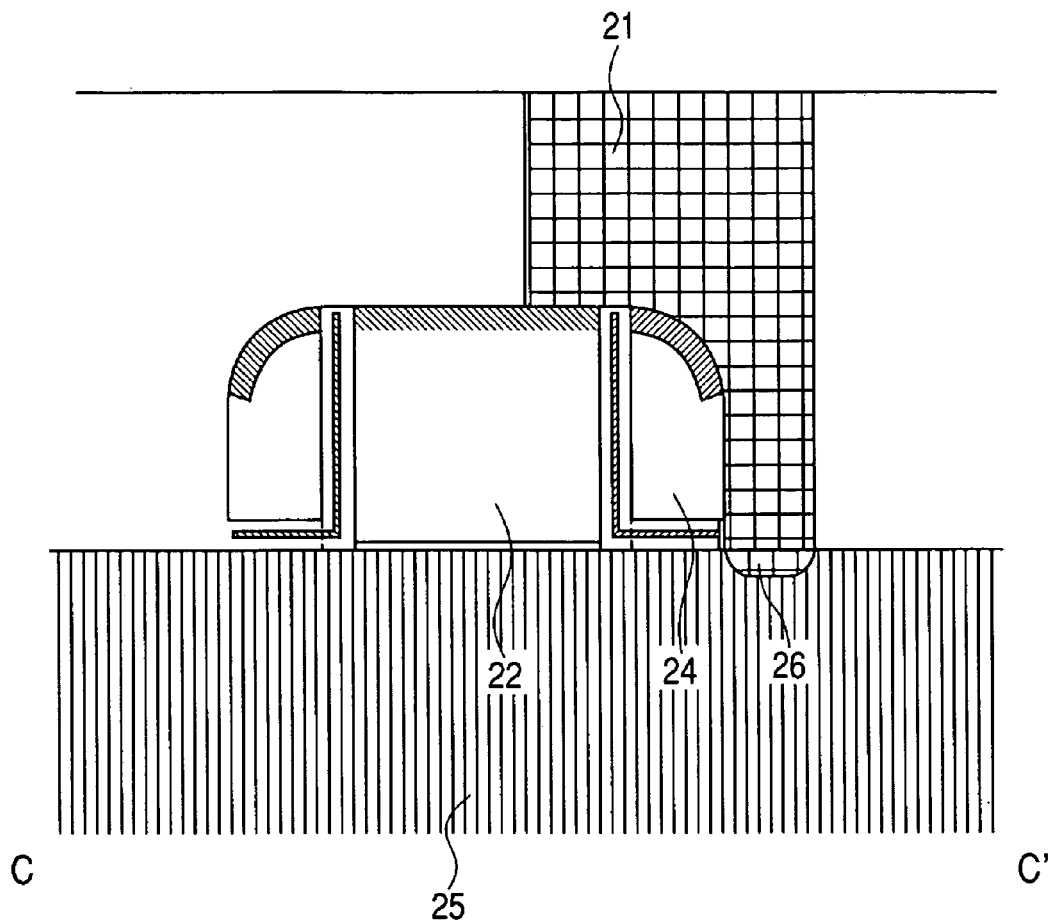
FIG. 25 is a cross sectional view of the contact area in the first embodiment of this invention.

Afterwards, as shown in FIG. 24, a first layer of insulator film 42 is deposited (or formed), planarized by CMP (chemical mechanical polishing), and the contact areas are formed. The contact 21 of the memory transistor gate electrode is formed on the external circumferential section of the auxiliary pattern 22 sufficiently separated from the selection gate electrode 12. Therefore, exposure of the gate electrode 12 of the selection transistor can be prevented even if the contact hole mask position alignment for example has deviated, and electrical shorts between the gate electrode of the memory gate and the gate electrode of the selection transistor can be prevented. The size of the normal contact hole is larger than the width of the side wall electrode formed on the external circumference of the auxiliary pattern so that forming the contact hole serves to expose the surface of the side wall electrode and the upper surface of the auxiliary pattern whose ONO film was removed, and a contact 21 is formed in that contact hole.

Contact holes for a contact 61 and a contact hole 42 are formed during forming of the contact hole for the contact 21, and their respective contacts are formed by the same process. After this (process), a metal wiring process is performed to form a standard three to six layers however a description is omitted here.

The detailed process flow of the stages of the process for forming the contact are shown in FIG. 26 through FIG. 29. These stages are expressed by the cross section B-B' in FIG. 17. The memory gate electrode at 60 nanometers is tiny and therefore possesses a high resistance. In order to achieve high-speed operation silicidation of the memory gate electrode must be performed to lower resistance in order to prevent a voltage drop along the word line. Silicidation is also required for the selection gate electrode and of both electrodes must be performed by the following procedure.

Figure 26:
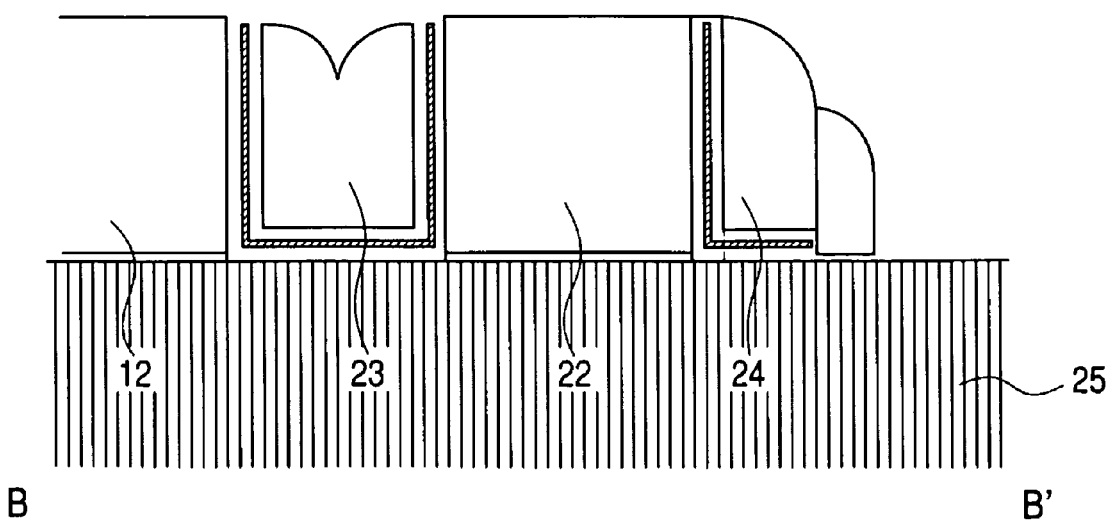
FIG. 26 is a concept view of the process flow during forming of the contact area in the first embodiment of this invention.
Figure 27:
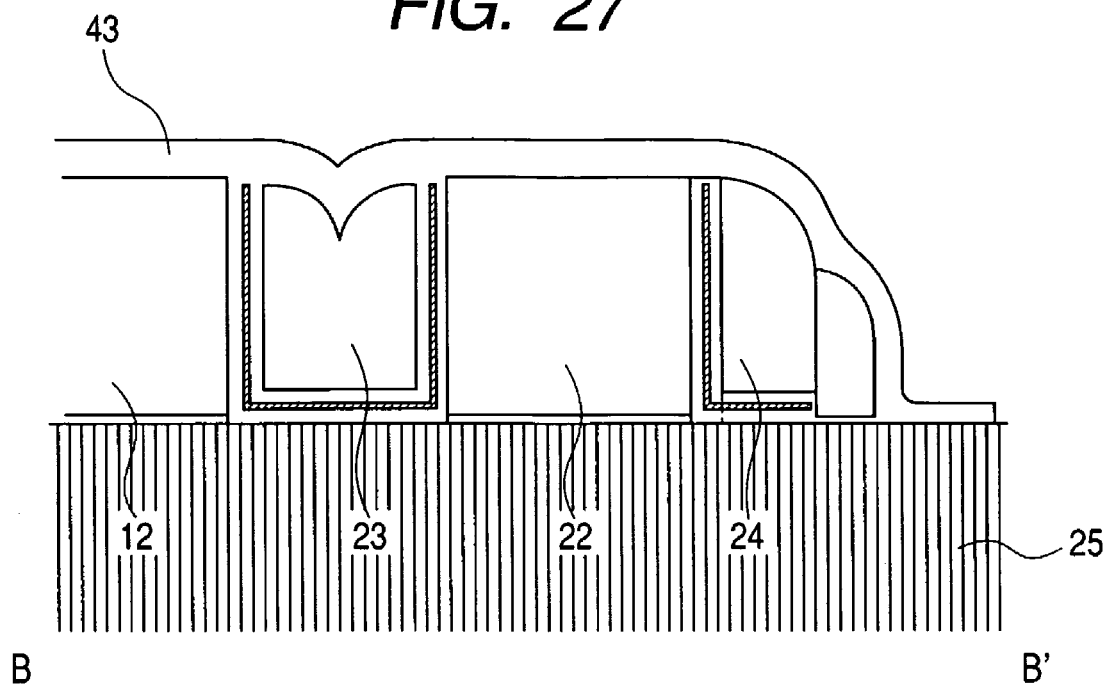
FIG. 27 is a concept view of the process flow during forming of the contact area in the first embodiment of this invention.

The stage for forming a $SiO_2$ spacer on the memory gate electrode side wall is shown in FIG. 26. Then, after ion implantation and activation anneal to the diffusion area of the logic area and memory area and activation anneal, the silicide metal film 43 is deposited by sputtering as shown in FIG. 27. Here, cobalt was utilized as the metal for silicidation.

Figure 28:
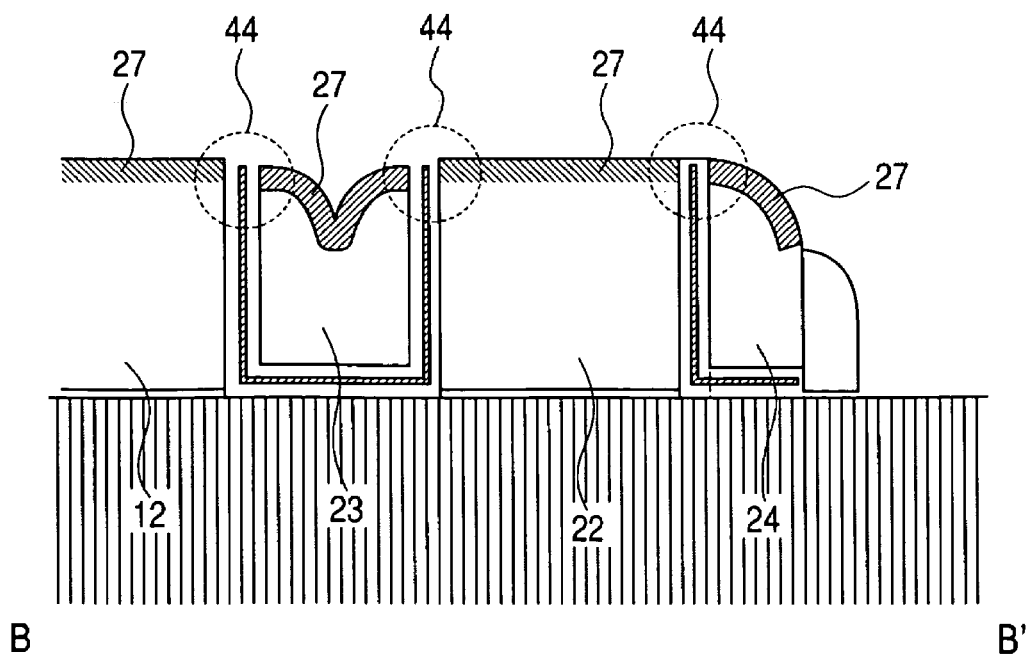
FIG. 28 is a concept view of the process flow during forming of the contact area in the first embodiment of this invention.

Then, after the silicidation anneal, the non-reacting cobalt is removed by wet etching and after once again performing activation annealing, a silicide layer 27 is formed as shown in FIG. 28.

By forming a silicide layer 27 where the cobalt reacts only with silicon, the silicide layer 27 is formed by self-alignment only above the upper section of the selection gate electrodes 12, contact auxiliary pattern 22, and memory gate electrode wiring layer 23, 24, without forming silicide on the ONO film upper section 44.

Figure 29:
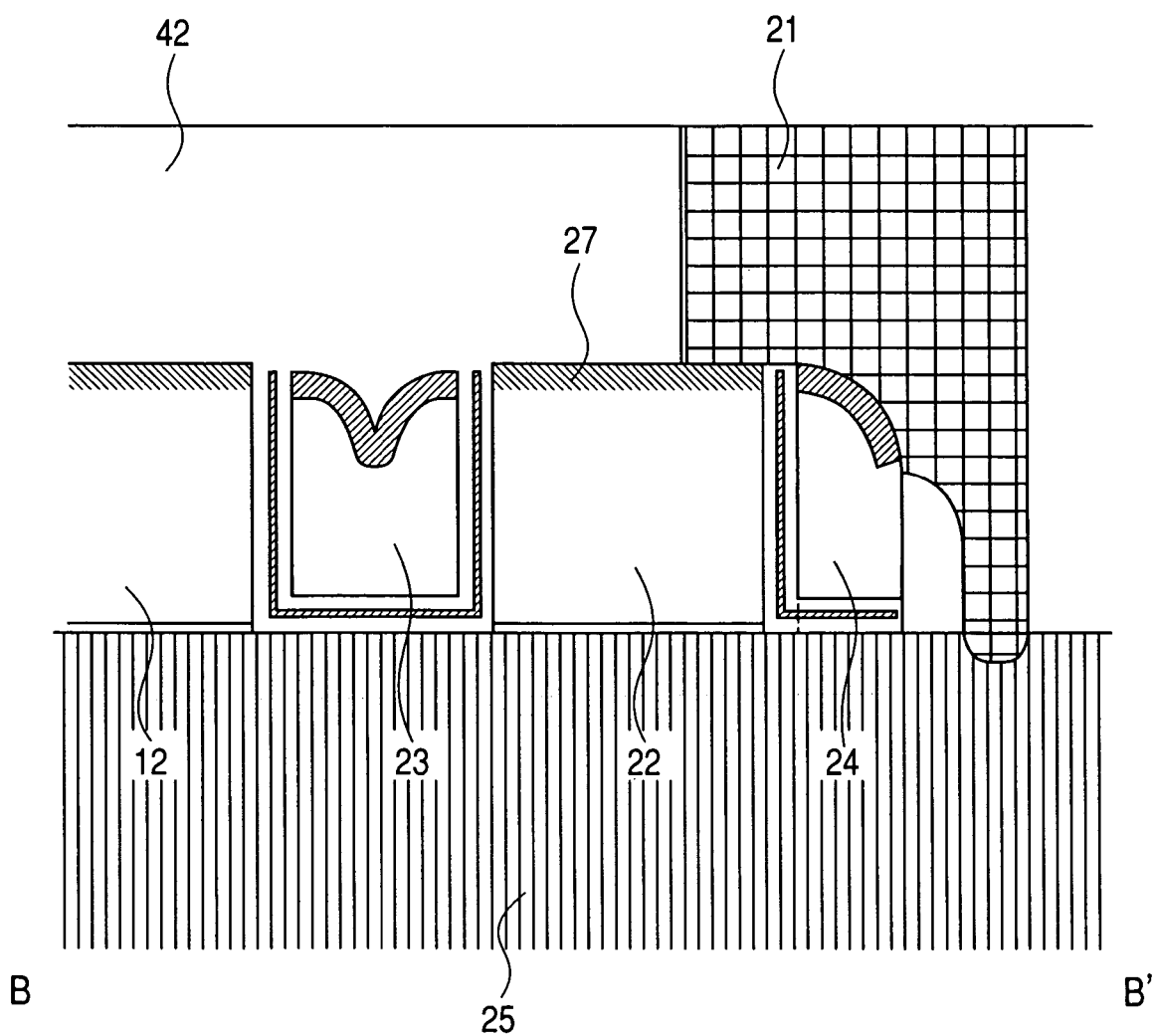
FIG. 29 is a concept view of the process flow during forming of the contact area in the first embodiment of this invention.
Figure 30:
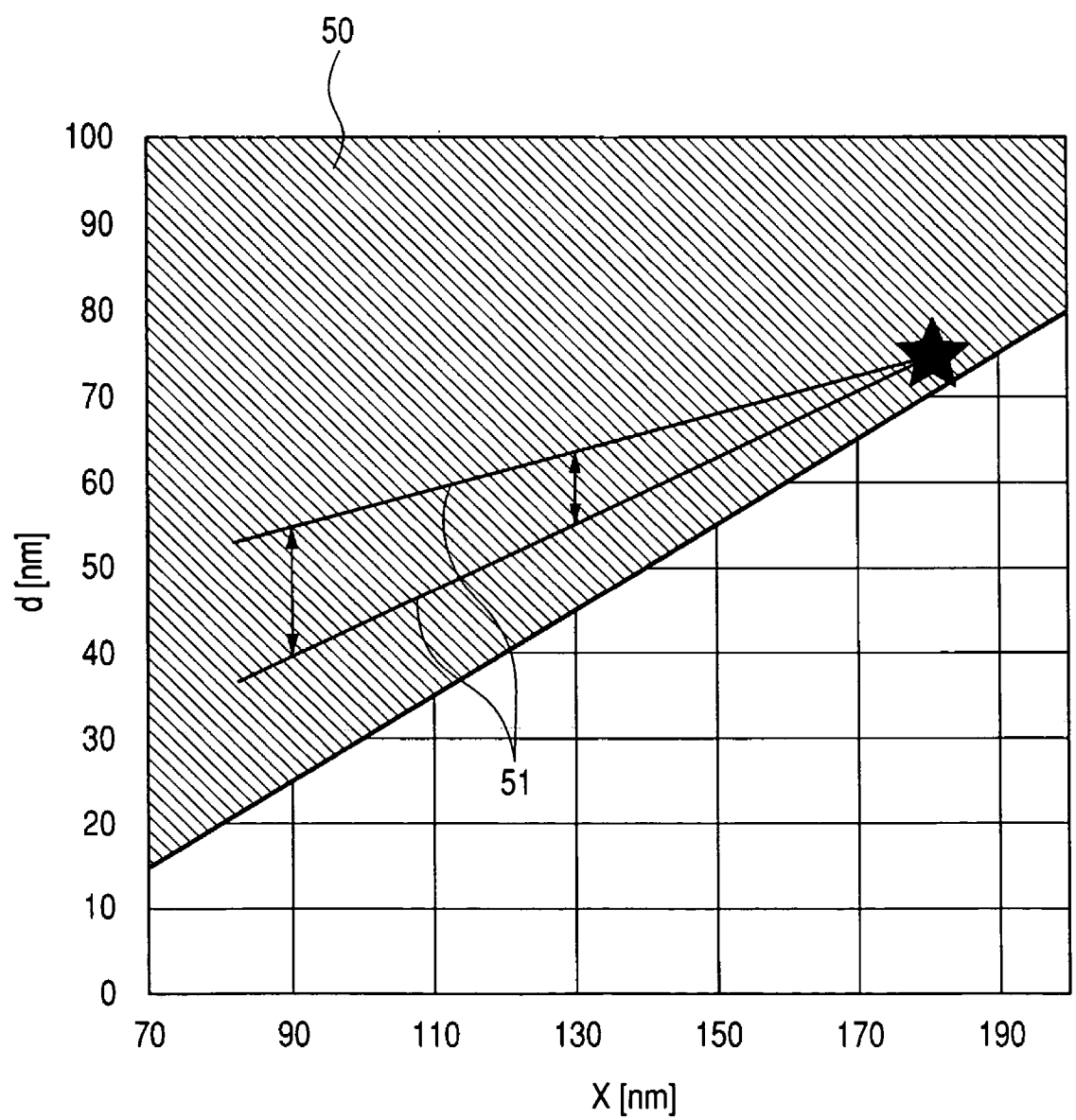
FIG. 30 is a graph showing conditions required for forming the contact area in the first embodiment of this invention.

After simultaneously siliciding each electrode, an interlayer insulator film 42 is deposited, and after removing the step by the CMP, the contact hole is formed, and the contact 21 then formed at the stage in FIG. 29. The contact 21 is formed on the side wall electrode 24 formed on the external circumference of the contact auxiliary pattern 22 at a sufficiently separated position in order to take alignment mismatch on deviations from the selection gate 12 into account. While the selection gate electrode is tiny at a width of 60 nanometers, the contact diameter is large at 250 nanometers so that the contact 21 makes contact not only with the memory gate electrode wiring section 24, but also with the contact auxiliary pattern 22 and the device isolator 25. The contact auxiliary pattern 22 is electrically isolated, and there will be no problem even if an electrical short occurs between the contact auxiliary pattern and the contact or memory gate. An example where the device isolator 25 is also etched during forming of the contact hole is shown in FIG. 29. However even if a section of the device isolator 25 is etched along its depth, and a contact formed in that section, the device isolator 25 is a field isolating insulator film so there will be no (shorting) problem.

A condition for forming this shape is that the gap x between the side surface of the contact auxiliary pattern 22 and the selection gate electrode 12 must be $x<2\times(t+d)$ where d is the polysilicon deposition thickness of the selection gate electrode and t is the ONO film thickness. This relation is shown in the graph in FIG. 30.

The gap x between the side surface of the contact auxiliary pattern 22 and the selection gate electrode 12 shown on the horizontal axis, and polysilicon film deposit thickness d is shown along the vertical axis. The ONO film thickness t must be a specified thickness or more in order to suppress leakage of stored electrical charges in the ONO film thickness t, and is assumed to be a fixed value of 20 nanometers since this value does not change according to scaling.

A region 50 capable of filling the gap between the contact auxiliary pattern and the selection gate is shown by the oblique line in the graph. The example in this embodiment utilizes a process for the 0.18 micrometer rule. The polysilicon depth d is 75 nanometers, and at $2\times(t+d)$ equals 190 nanometers. Polysilicon can be filled into formed even smaller than this value. The extension line 51 is shown as a prediction for next generation scaling however the margin can be expanded even further to allow for a generation to 90 nanometers.

In order to reliably ensure the required described conditions, in view of future gate lengths for memory gate electrodes, the gap between the side surface of the auxiliary pattern 22 and the side surface of the selection gate 12 may be formed so as to be within double the sum of the ONO film thickness and the memory gate electrode gate length.

An important factor not related in detail up until now regarding the forming position of the contact 21 is that as shown in FIG. 17 and FIG. 31, the contact 21 is preferably formed in the direction the selection gate electrode 12 extends versus the auxiliary pattern 22. Forming the contact 21 in this position prevents the contact 21 from electrically shorting to the selection gate electrodes. In other words, forming the contact 21 in a region between the selection gate electrode 12 and the auxiliary pattern 22, when a deviation in the alignment of the contact hole mask has occurred during forming of the contact holes for the memory gate electrode, will expose the surface of the selection gate, and then forming the contact will cause an electrical short between the selection gate electrode 12 and the contact for the memory gate electrode power supply.

Electrical shorts between memory gate electrodes can also be prevented by forming the contact as described above. In other words, when attempting to form the contact in a region between the auxiliary pattern 22 (auxiliary pattern 22 on left side of FIG. 17) and the adjoining memory gate electrode 11 (memory gate electrode 11 on right side of FIG. 17), and a deviation in position alignment of the contact hole forming mask has occurred, then when forming the contact holes for the memory gate electrode on the left side of FIG. 17, the surface of the memory gate electrode (memory gate electrode 11 on the right side of FIG. 17) is exposed, and the surfaces of the memory gate electrodes 11 on both left and right of one contact hole in FIG. 17 are exposed, so that forming the contact causes the memory gate electrode 11 and the contact to short and the memory gate electrodes short with each other. A layout is therefore required that takes into account deviations in the mask position between the auxiliary pattern 22 (auxiliary pattern 22 on left side of FIG. 17) and the adjoining memory gate 11 (memory gate electrode 11 on right side of FIG. 17), and the width of the auxiliary pattern 22 (auxiliary pattern 22 on left side of FIG. 17) and the selection gate electrode 12 (selection gate electrode on right side of FIG. 17) must be widened.

The contacts 21 are therefore preferably formed in the direction the selection gate electrode extends versus the auxiliary pattern 22. More specifically, the contacts 21 are formed on the corners perpendicular to the direction that the selection gate electrode for auxiliary pattern 22 extends. Forming the contacts 21 in this way reduces the possibility of electrical shorts and eliminates the need to widen the width between the selection gates 12.

Even more preferable as shown in FIG. 17 and FIG. 31, is forming the contacts 21 between the pair of side wall electrodes formed on the corner sides along the direction the selection gate electrode extends among the four sides of the auxiliary pattern 22. By forming the contact 21 (contact 21 on left side of FIG. 17) in this way, there is no contact with the adjoining memory gate electrodes 11 (memory gate 11 on right side of FIG. 17), and the contact 21 does not make contact with the selection gate electrode 12 (selection gate 12 on left side of FIG. 17). The contact 21 also does not protrude outward from the side wall electrodes formed on the periphery of the auxiliary pattern 22 (auxiliary pattern 22 on left side of FIG. 17) in a direction perpendicular to the direction the selection gate electrodes extend, so that the memory gate electrodes 11 (memory gate electrode 11 on right side of FIG. 17) and the side wall electrode formed on the periphery of the auxiliary pattern 22 can be formed together up to a minimum dimension within a range where they do not make contact. Therefore, when the size of the auxiliary patterns 22 are the same, the pitch width between the selection gates can be reduced, and the memory array can be more highly integrated.

The electrode that must utilize the contact 21 relative to the direction the selection gate electrode extends is the side wall electrode. However, the width of the sidewall electrode is formed by self-alignment and so is narrower than the width of the contact 21. Therefore, the side wall electrode is formed mainly in the center of the contact. Consequently, the contact must be formed at a position to make contact with the auxiliary pattern 22, and further must make contact with the field isolating insulator (film).

The invention of these specifications is therefore capable of simplifying the process for manufacturing nonvolatile memories for high-speed operation and possessing a split-gate structure.

The invention of these specifications is also capable of reducing the pitch width between the selection gates and making the memory array more highly integrated.

Second Embodiment

As an adaptation of the first embodiment, the second embodiment is described using an example for connecting the side wall electrode to another word line. A flat view of the layout of the contact region of the second embodiment is shown in FIG. 32.

Figure 32:
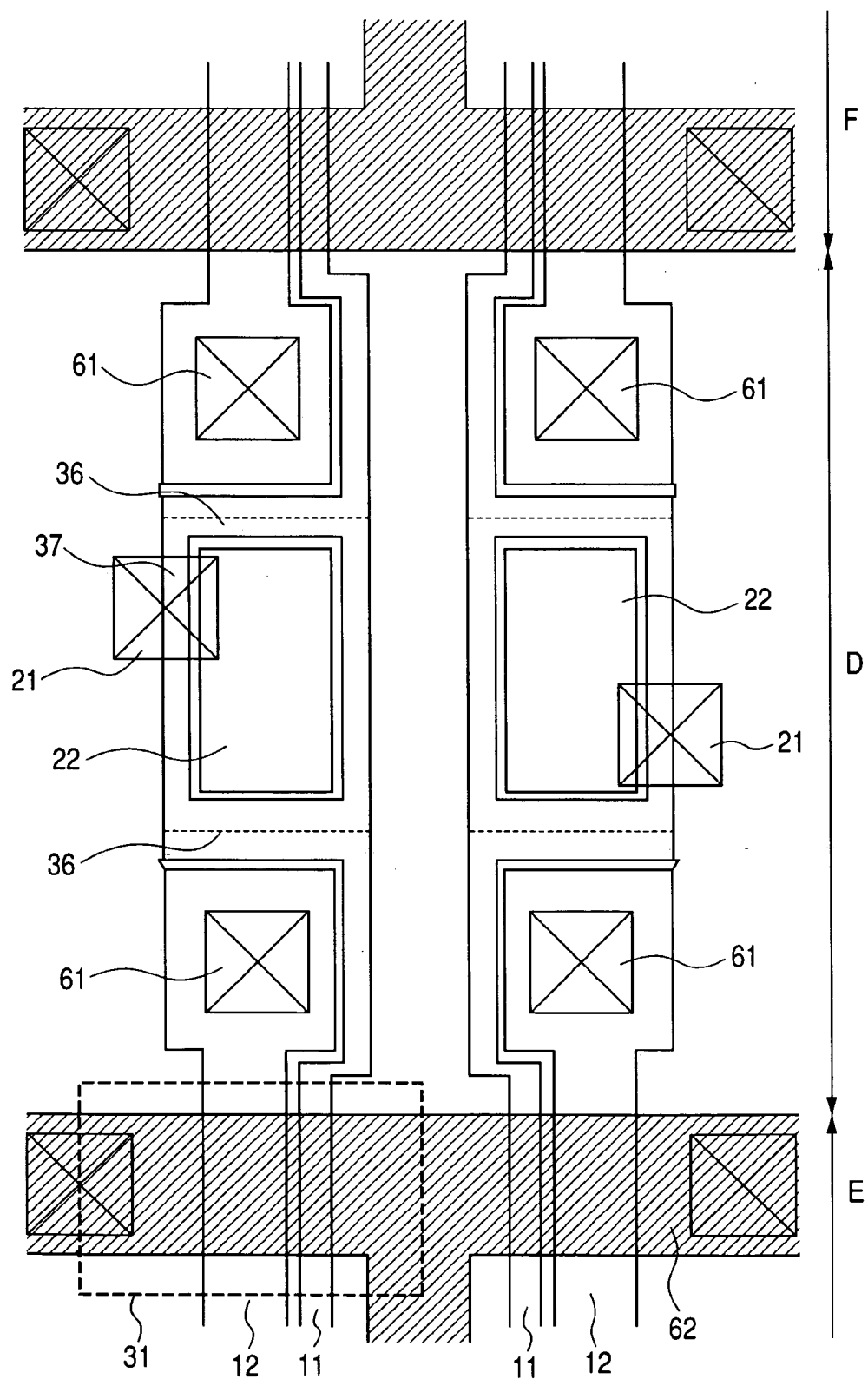
FIG. 32 is a layout view of the contact area of the second embodiment of this invention.

As shown in FIG. 32, the selection gate electrode within the first memory array region E and the second memory array region F are physically separated on the field isolating insulator (film) and an auxiliary pattern 2 is formed in between them. The respective memory gate electrodes are connected to the side wall electrodes formed on the periphery of the auxiliary pattern, and by forming a contact over those side wall gate electrodes, power can be supplied from the contact to the memory gate electrode within the first memory array region and the memory gate electrode within the second memory array region. Utilizing this type of structure eliminates the need to form an auxiliary pattern between the adjacent selection gates. The pitch between the adjacent selection gate electrodes, namely (the pitch) between the word lines can be narrowed, and the region E and the memory array within F can be made more highly integrated, perpendicular to the direction that the selection gate electrode extends.

The manufacturing method for the second embodiment of this invention is described next. The manufacturing method of the second embodiment is identical to the first embodiment in FIG. 18 through FIG. 24. The point where the second embodiment differs is the positional relationship between the selection gate electrode and the auxiliary pattern in the flat layout. As shown in FIG. 32, the selection gate electrodes are physically separated on the field isolating insulator (film) and, an auxiliary pattern is formed between those separated selection gates. Here, the important point is the distance between the side surface of the auxiliary gate pattern and the side surfaces of the respective gate electrodes. The respective gate electrodes are formed at a position closer than a distance of twice the sum of the film thickness of the gate electrode material for the memory gate formed by self alignment, and the film thickness of the ONO film formed later within that distance (between gate pattern and gate electrodes). Forming the gate electrodes at this position allows forming the self-aligned memory gate electrodes, relative to the memory cells within the region D and E, however memory gate electrode material that is not physically separated still remains between each selection gate electrode and the auxiliary pattern on the field isolating insulator (film). Consequently, forming a contact on the side wall electrode formed on the periphery of the auxiliary pattern, allows supplying power to the memory gate electrodes via the side wall electrodes.

The placement of the contact is described here. The direction the selection gate electrode 12 extends and its perpendicular direction, and the placement of the contact are reversed from the positional relation in the first embodiment. In other words, in the second embodiment, the auxiliary pattern is enclosed from above and below by the selection gate electrodes 12 so that when the contacts are formed on the side perpendicular to the direction that the selection gate electrode extends among the four side of auxiliary pattern 22, then a short might possibly in the upper and lower selection gate electrodes of the auxiliary pattern 22 on FIG. 32 due to a deviation in the mask position alignment. The contact is therefore preferably not formed to overlap on the sides perpendicular to the direction the selection gate electrode of the auxiliary pattern extends. However the contacts are preferably formed in a region between the pair of side wall electrodes formed on the sides in a perpendicular direction. Moreover, even if a deviation in position alignment of the contact 21 occurs perpendicular to the direction that the selection gate electrode extends, the side wall electrode and the contact are placed correctly so that the contact is positioned to make contact with the auxiliary pattern 22 and the field isolating insulator film.

The forming of the contact in the memory array was described in the present embodiment. However the pitch between the selection gate electrodes can be reduced by forming an auxiliary pattern along the selection gate electrode extension for the contact at the tip of the memory gate electrode of the memory array.

The present embodiment contains a silicidation process of the gate electrode as in the first embodiment; however, he silicidation process is not an indispensable process in terms of making the memory array more highly integrated. However, silicidation of the gate electrode can prevent higher resistance in the gate electrode that occurs when the gate electrode is reduced to a tinier size, and a nonvolatile memory capable of high-speed operation can be fabricated.

In this type of embodiment, the contact region for the memory gates can be separated from the selection gate electrodes so that for example even if a deviation in mask position alignment occurs, a memory gate contact can be formed without electrical shorts occurring between the memory gate electrode and the selection gate electrode.

A dedicated mask is not required for forming the auxiliary pattern so the number of masks can be reduced and the manufacturing cost can also be drastically reduced. There are also fewer processes so that a high-performance nonvolatile memory can be easily fabricated.

There is also no need to form a contact region between adjacent word lines so the word line pitch can be further narrowed, and higher integration can be easily achieved.

Third Embodiment

This embodiment is a variation on the first and second embodiments, in which the side wall electrodes are connected to other word lines. A flat layout of the contact region of the third embodiment is shown in FIG. 38.

Figure 38:
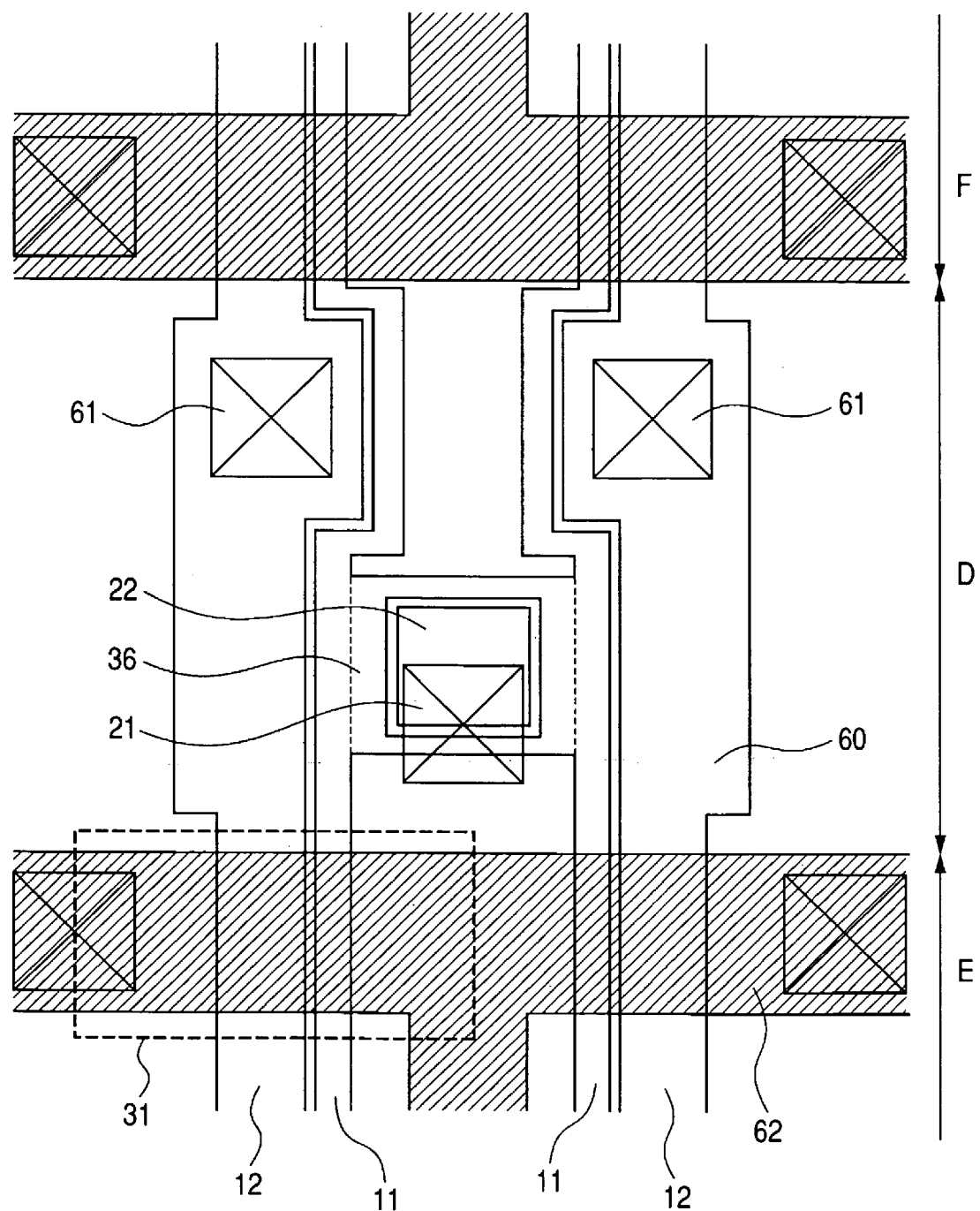
FIG. 38 is a layout view of the contact area of the third embodiment of this invention.

As shown in FIG. 38, an auxiliary pattern is formed between the adjoining selection gate electrodes. Up to here it is identical to the first embodiment however the unique feature of this embodiment is that the opposing adjacent memory electrodes are connected by one auxiliary pattern. In other words, the adjacent memory gate electrodes are connected with side wall electrodes formed on the periphery of the auxiliary pattern, and power can be supplied from the contact to the respective memory gate electrodes, by forming contacts on these side wall gate electrodes. Utilizing this type of structure allows further narrowing the distance between the adjacent memory gate electrodes. Therefore the pitch between the selection gate electrodes, or in other words, (the pitch) between the word lines can be narrowed, and the memory array within the regions E and F can be highly integrated, perpendicular to the direction the selection gate electrode extends. Moreover, one contact can be formed for the adjacent memory gate electrodes so that the number of contacts can be reduced. Forming of the wiring (layers) on the upper layers is made simpler since there are fewer contacts.

The manufacturing method for the third embodiment of this invention is described next. The manufacturing method is the same as in FIG. 18 through FIG. 24 in the first embodiment. The point where the present embodiment differs is the positional relation of the selection gate electrode and auxiliary pattern in the flat layout. As shown in FIG. 38, an auxiliary pattern is formed between the adjacent selection gate electrodes. Here, the important point is that the distance between the side surface of the auxiliary gate pattern and the side surfaces of the respective gate electrodes. The gate electrodes are respectively formed at a position closer than a distance of twice the sum of the film thickness of the gate electrode material of the memory gates formed by self alignment, and the film thickness of the ONO film formed later within that distance. Forming the gate electrodes at this position allows forming the self-aligned memory gate electrodes, relative to the memory cells within the region D and E, however memory gate electrode material that is not physically separated still remains between each selection gate electrode and the auxiliary pattern on the field isolating insulator (film). Consequently, forming a contact on the side wall electrode formed on the periphery of the auxiliary pattern, allows supplying power to the memory gate electrodes via the side wall electrodes.

The placement of the contacts is identical to the first embodiment so a description is omitted here.

The present embodiment contains a process for siliciding the gate electrode as in the first embodiment, the siliciding process is not however an indispensable process in terms of making the memory array more highly integrated. However, siliciding the gate electrode can prevent higher resistance in the gate electrode that occurs when the gate electrode is reduced to a tinier size, and a nonvolatile memory capable of high-speed operation can be fabricated.

In the present embodiment, the adjacent gate electrodes are electrically connected so that the voltages across adjacent gate electrodes cannot be separately controlled. However the nonvolatile memory in the present embodiment is the type that holds the electrical charge by means of a charge trapping film so that unlike the floating gate type of nonvolatile memory, there will be no problem even if the memory gate electrodes are mutually connected electrically. Also, in the nonvolatile memory in the present embodiment, the electrically connected gate electrodes are memory gates and therefore the selection gate electrodes can be separately controlled so that the respective memory cells can be selected by controlling the selection transistor so that the writing on a desired memory cell can be performed.

Utilizing this type of embodiment allows separating the memory gate contact region from the selection gate electrodes so that for example, even if a deviation in the mask position alignment occurs, the memory gate contacts can be formed and there will be no electrical shorts between the memory gate electrodes and the selection gate electrodes.

A dedicated mask is not required for forming the contact regions so the number of masks can be reduced and the manufacturing cost can also be drastically reduced. There are also fewer processes so that a high-performance nonvolatile memory can be easily fabricated.

In the first embodiment, there was one auxiliary pattern for one memory gate electrode, so that among opposing memory gate electrodes, the selection gate electrode and the auxiliary pattern of the memory gate electrode not requiring power, had to be separated by a fixed distance. However in the present embodiment, there is no need to separate them (selection gate electrode and auxiliary pattern) by a fixed distance so the word line pitch can be narrowed, and higher integration can be easily achieved.

Moreover, one contact can be formed for the adjacent memory gate electrodes so that the number of contacts can be reduced. Forming of the wiring (layers) on the upper layers is therefore made simpler since there are fewer contacts.

Fourth Embodiment

The fourth embodiment utilizes an example where multiple auxiliary patterns are formed. In the present embodiment, the case where applied to the first embodiment is described.

Figure 39:
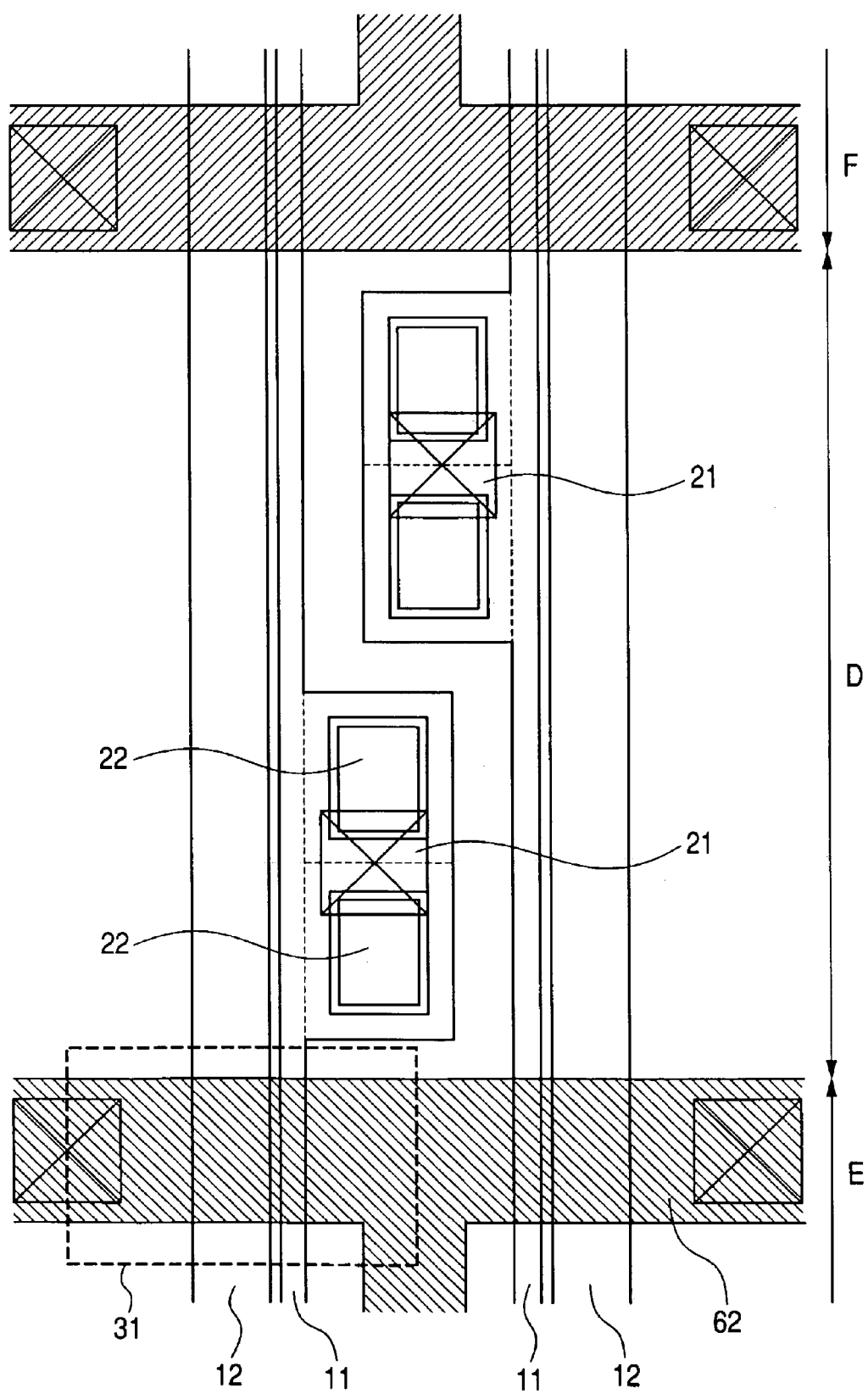
FIG. 39 is a layout view of the contact area of the fourth embodiment of this invention.

The flat layout of the fourth embodiment is shown in FIG. 39. In the example in this figure, two auxiliary patterns are formed for one selection gate electrode. Here, memory gate electrode material is formed in the auxiliary pattern, the same as the memory gate electrode material formed between the auxiliary pattern and the selection gate electrode. The unique feature of this embodiment is that a contact for the memory gate electrode is formed in the auxiliary pattern, and that the contact is formed over the side wall electrode and the auxiliary gate electrode.

The manufacturing method of this embodiment is described next. In this embodiment, the auxiliary patterns may be respectively positioned so that the distance to the side surface of the selection gate electrode, and the respective side surfaces of two auxiliary patterns, are at a position closer than double the sum of thickness of the ONO film formed later (after the side surfaces) and the film thickness of the gate electrode material of the memory gate formed by self-alignment.

In the present embodiment, during forming of the contact holes after the forming of the interlayer dielectric (insulator) film, only the side wall gate electrode and the auxiliary gate electrodes can be exposed without exposing the field isolating insulator film so that defects due to forming the contact on the field isolating insulator (film) can be prevented without etching the field isolating insulator film during etching of the contact holes. Defects that occur in particular due to penetrating of the field isolating insulator (film) and making an electrical connection with the semiconductor substrate can be avoided.

In the present embodiment, two auxiliary patterns were positioned at respective desired distance from the selection gate electrodes. However, one of the auxiliary patterns (first auxiliary pattern) may be formed at a desired distance from the selection gate, and the other auxiliary pattern (second auxiliary pattern) may be formed at a desired distance only relative to the auxiliary pattern (first auxiliary pattern). However, when positioned in this way, the width between the adjacent word lines must be widened so that when forming multiple auxiliary patterns in this embodiment, each of them must be formed at the respective desired distance from the selection gate electrode.

In the present embodiment, the forming of two auxiliary patterns was described however two or more auxiliary patterns may be formed for one gate electrode.

In the present embodiment, besides the effect described in the first embodiment, defects can be avoided by etching the field isolating insulator film, and forming a contact in that field isolating insulator film.

Though this embodiment was described with an example for the first embodiment, the present embodiment is also applicable to the second and third embodiments. Besides the effects described in the second and third embodiments, defects due to etching the field isolating insulating film and forming the contact in that film can be prevented.

Fifth Embodiment

The example in the fifth embodiment applies the SAC (Self Aligned Contact) to the contact. The memory cell and array structure, and contact section surface layout are the same as the first embodiment. The process flow of the contact forming stage is shown in FIG. 33 through FIG. 37.

FIG. 33 through FIG. 37 are views taken along lines B-B' of FIG. 17.

Figure 33:
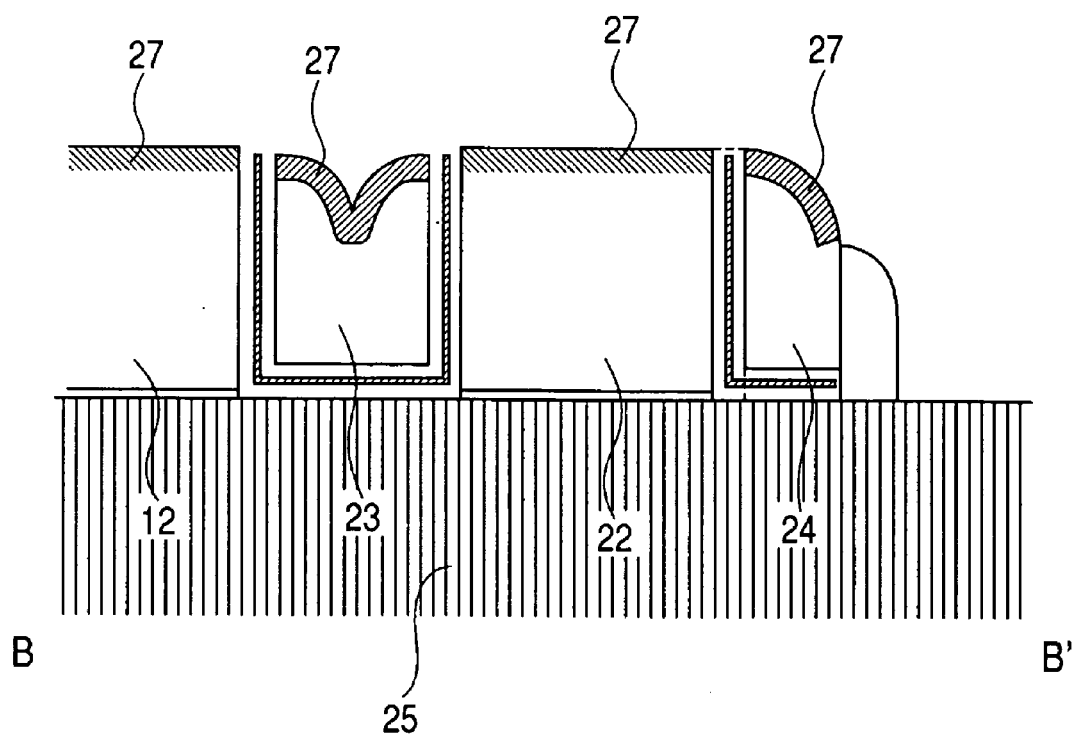
FIG. 33 is a concept view of the process flow during forming of the contact area in the fifth embodiment of this invention.
Figure 34:
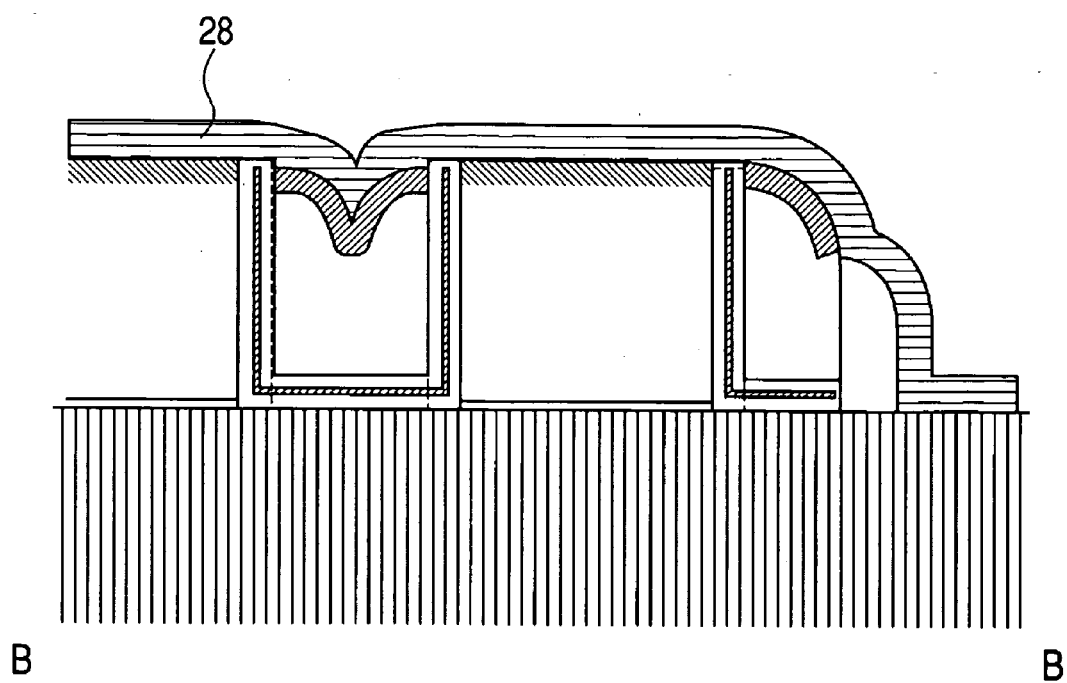
FIG. 34 is a concept view of the process flow during forming of the contact area in the fifth embodiment of this invention.
Figure 35:
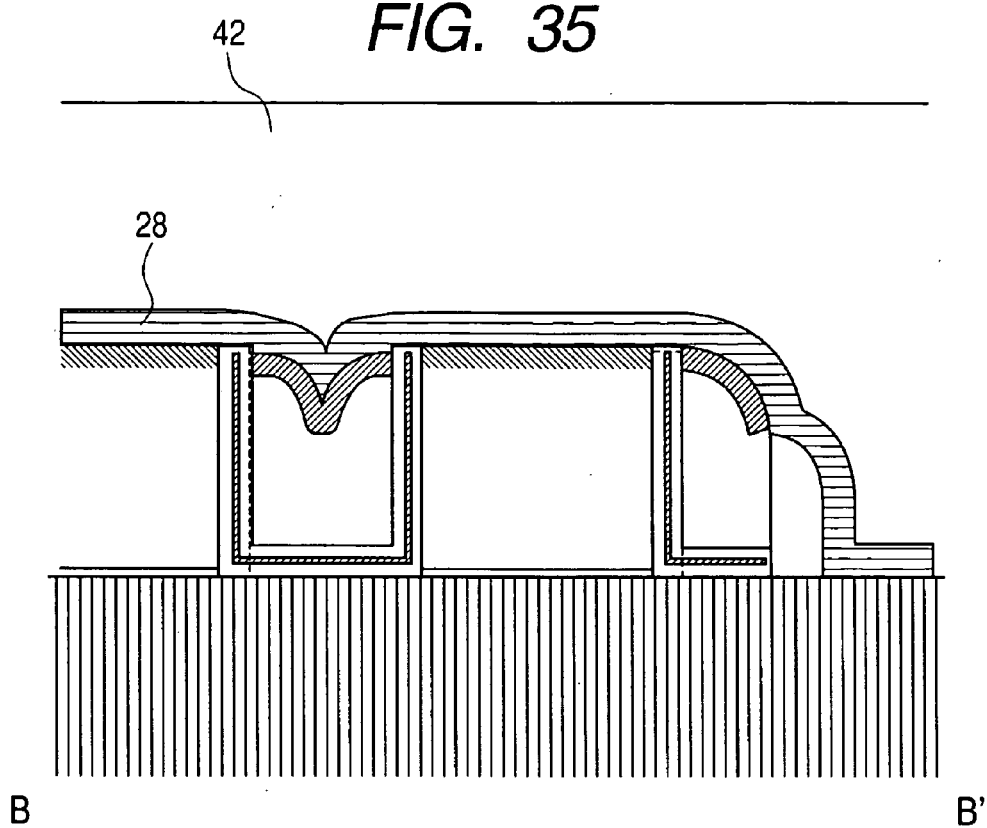
FIG. 35 is a concept view of the process flow during forming of the contact area in the fifth embodiment of this invention.

FIG. 33 shows the stage where the selection gate electrode and the memory gate electrode upper section are silicided by the method of the first embodiment. The etching stopper shown here is a state in FIG. 34 where a SiN film 28 was deposited to 50 nanometers by the CVD method. After depositing $SiO_2$ film to 1200 nanometers as the first layer of the insulator film 42, the roughness (concavities, protrusions) on the surface are planarized by the CMP at the stage shown in FIG. 35.

Figure 36:
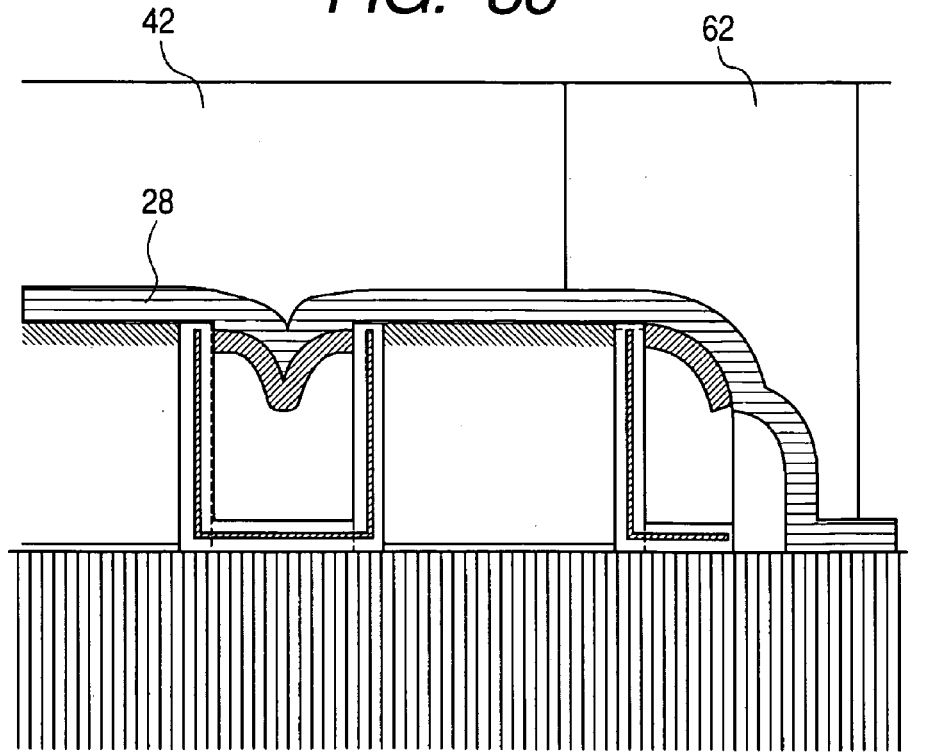
FIG. 36 is a concept view of the process flow during forming of the contact area in the fifth embodiment of this invention.

The contact hole 62 is formed by photolithography and dry etching. The dry etching is performed in the following multiple stages. First of all, after etching the BARC layer (anti-reflective layer) to improve the resolution, the $SiO_2$ is etched under conditions where the $SiO_2$ possesses a higher selectivity rate than SiN. In this way, the SiN layer 28 functions as a stopper, and even if there is a gate electrode step as shown in FIG. 36, the etching essentially stops at the point in time that the SiN is exposed so that no over-etching occurs.

Figure 37:
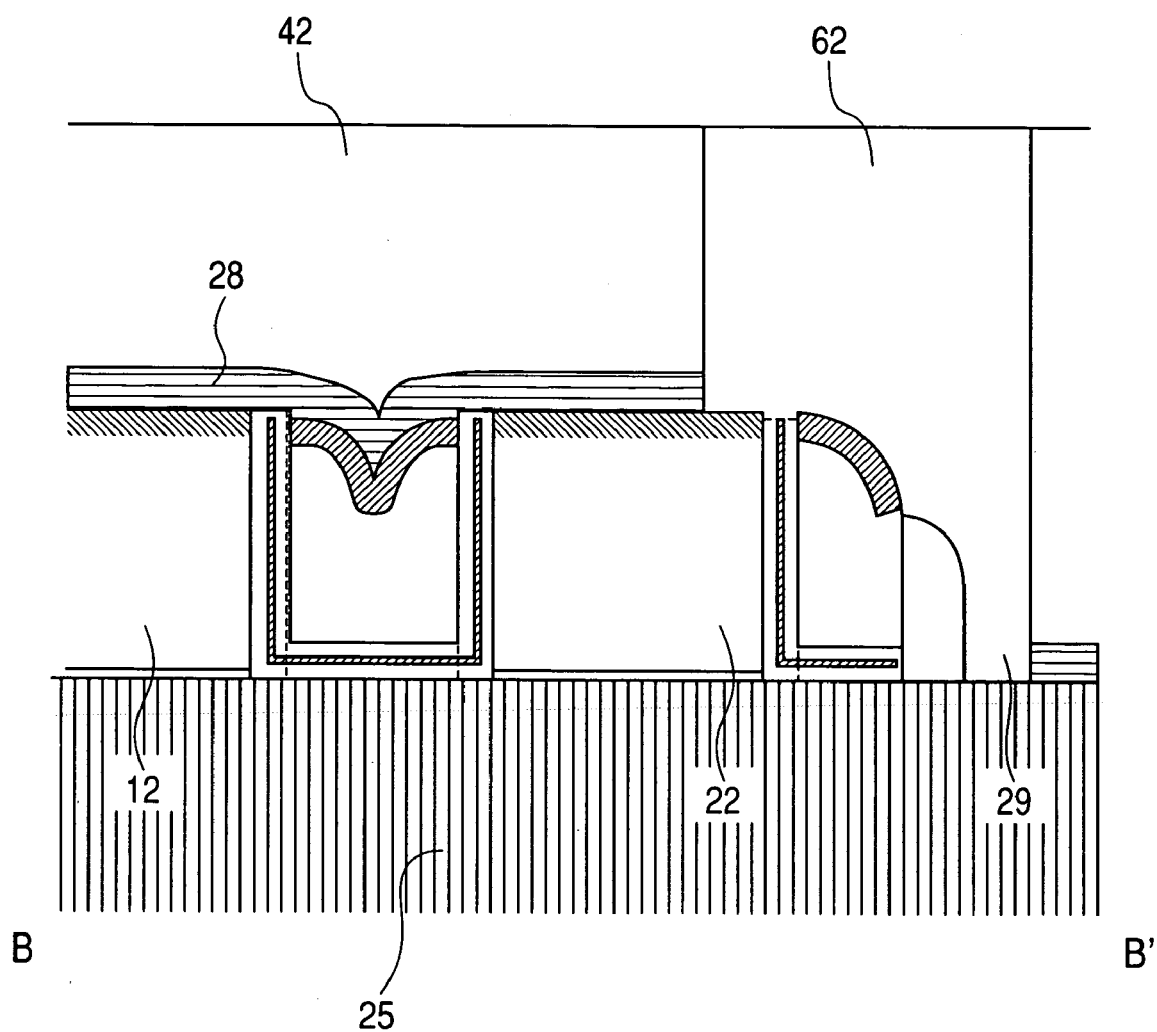
FIG. 37 is a concept view of the process flow during forming of the contact area in the fifth embodiment of this invention.

Next, when etching is performed under conditions where the SiN etching selection rate is higher than the $SiO_2$, then only the SiN is exposed to attain the state in FIG. 37. The $SiO_2$ is difficult to etch so that even when the contact deviates from the mesh and reaches the field isolating insulator region (device isolation region) as shown in FIG. 29, there is no excessive removal of $SiO_2$. Therefore, in this invention there is no excessive etching of the field isolating insulator film when forming the contact holes 62 so that defects can be avoided by forming the contact within the etched section.

What is claimed is:

1. A semiconductor manufacturing method for a memory cell array of a semiconductor device, comprising:
   depositing a first conductive film over a semiconductor substrate and forming a first gate electrode and an auxiliary pattern electrically isolated from the first gate electrode;
   forming a first insulator film over the first gate electrode, the auxiliary pattern, and the semiconductor substrate;
   depositing a second conductive film over the first insulator film and, by etching back the second conductive film, respectively forming a side wall electrode along the first gate electrode interposing the first insulator film between the side wall electrode and the first gate electrode, and forming an extended electrode on a circumference of the auxiliary pattern as said extended electrode merges with side wall electrode;
   exposing the upper surface of the auxiliary pattern and the first gate electrode by stripping away the first insulator film formed over the first gate electrode and the auxiliary pattern;
   siliciding the upper surface of the first gate electrode, and the surface of the side wall electrode;
   forming a second insulator film over the auxiliary pattern and the extended electrode;
   forming at least one or more contact holes on the second insulator film and, exposing the extended electrode at the forming of one of the contact holes; and
   forming contacts in the contact holes.

2. A semiconductor manufacturing method for a semiconductor device according to claim 1, wherein the surface of the semiconductor substrate is subjected to silicidation.

3. A semiconductor manufacturing method for a semiconductor device according to claim 1, wherein the first insulator film is a multilayer film formed from multiple different materials.

4. A semiconductor manufacturing method for a semiconductor device according to claim 1, wherein the first insulator film includes a charge trapping film.

5. A semiconductor manufacturing method for a semiconductor device according to claim 4, wherein the charge trapping film is a silicon nitride film.

6. A semiconductor manufacturing method for a semiconductor device according to claim 1, wherein the auxiliary pattern is formed at a position closer than a distance of twice the sum of the first insulator film thickness and the second conductive film thickness from the side surface of the first gate electrode.

7. A semiconductor manufacturing method for a semiconductor device according to claim 1, wherein the auxiliary pattern includes at least a first auxiliary pattern and a second auxiliary pattern and, the first auxiliary pattern is formed at a position from the side surface of the first gate electrode closer than a distance of twice the sum of the first insulator film thickness and the second conductive film thickness, and the second auxiliary pattern is formed at a position from the side surface of the first auxiliary pattern closer than a distance twice the sum of the first insulator film thickness and the second conductive film thickness.

8. A semiconductor manufacturing method for a semiconductor device according to claim 7, wherein the second auxiliary pattern is formed at a position closer than a distance twice the sum of the first insulator film thickness and the second conductive film thickness, from the side surface of the first gate electrode.

* * * * *